United States Patent
Misawa et al.

(10) Patent No.: US 12,476,597 B2
(45) Date of Patent: Nov. 18, 2025

(54) AMPLIFIER CIRCUIT

(71) Applicant: SUMITOMO ELECTRIC INDUSTRIES, LTD., Osaka (JP)

(72) Inventors: Taichi Misawa, Osaka (JP); Keiji Tanaka, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 540 days.

(21) Appl. No.: 18/170,014

(22) Filed: Feb. 16, 2023

(65) Prior Publication Data
US 2023/0268895 A1 Aug. 24, 2023

(30) Foreign Application Priority Data
Feb. 24, 2022 (JP) .................. 2022-026414

(51) Int. Cl.
*H03F 3/45* (2006.01)
*H03F 1/22* (2006.01)
*H03F 1/26* (2006.01)

(52) U.S. Cl.
CPC .......... *H03F 3/45089* (2013.01); *H03F 1/22* (2013.01); *H03F 1/26* (2013.01)

(58) Field of Classification Search
CPC .......... H03F 3/45089; H03F 1/22; H03F 1/26; H03F 2203/45722

USPC .................................... 330/25, 253
See application file for complete search history.

(56) References Cited

U.S. PATENT DOCUMENTS

2006/0181347 A1* 8/2006 Baskett .............. H03F 3/45085
330/252

FOREIGN PATENT DOCUMENTS

JP 2019-016982 1/2019

* cited by examiner

*Primary Examiner* — Andrea Lindgren Baltzell
*Assistant Examiner* — Khiem D Nguyen
(74) *Attorney, Agent, or Firm* — IPUSA, PLLC

(57) ABSTRACT

An amplifier circuit includes a first cascode transistor and a second cascade transistor, the first cascade transistor being electrically connected between a first transistor and a first load circuit, the second cascode transistor being electrically connected between a second transistor and a second load circuit. The amplifier circuit includes a first shunt transistor and a second shunt transistor, the first shunt transistor being electrically connected between the first transistor and a first emitter-follower circuit, the second shunt transistor being electrically connected between the second transistor and a second emitter-follower circuit. A differential current signal includes a first differential current and a second differential current, the first differential current flowing through the first cascode transistor and the second cascode transistor, and a second differential current flowing through the first shunt transistor and the second shunt transistor.

8 Claims, 13 Drawing Sheets

FIG.10

$$SNR = 10\left\{erfc^{-1}\left(\frac{4}{3}BER\right)\right\}^2 \cdots (1)$$

$$BER = \frac{1}{2}SER$$

$$= \frac{1}{2}\left[\frac{1}{4}P(0\ to\ 1) + \frac{1}{4}\{P(1\ to\ 0) + P(1\ to\ 2)\} + \frac{1}{4}\{P(2\ to\ 1) + P(2\ to\ 3)\} + \frac{1}{4}P(3\ to\ 2)\right] \cdots (2)$$

$$P(0\ to\ 1) = \frac{1}{2}\text{erfc}\left(\frac{t01-\mu0}{\sigma0}\frac{1}{\sqrt{2}}\right) \cdots (3)$$

$$P(1\ to\ 0) = \frac{1}{2}\text{erfc}\left(\frac{\mu1-t01}{\sigma1}\frac{1}{\sqrt{2}}\right) \cdots (4)$$

$$P(1\ to\ 2) = \frac{1}{2}\text{erfc}\left(\frac{t12-\mu1}{\sigma1}\frac{1}{\sqrt{2}}\right) \cdots (5)$$

$$P(2\ to\ 1) = \frac{1}{2}\text{erfc}\left(\frac{\mu2-t12}{\sigma2}\frac{1}{\sqrt{2}}\right) \cdots (6)$$

$$P(2\ to\ 3) = \frac{1}{2}\text{erfc}\left(\frac{t23-\mu2}{\sigma2}\frac{1}{\sqrt{2}}\right) \cdots (7)$$

$$P(3\ to\ 2) = \frac{1}{2}\text{erfc}\left(\frac{\mu3-t23}{\sigma3}\frac{1}{\sqrt{2}}\right) \cdots (8)$$

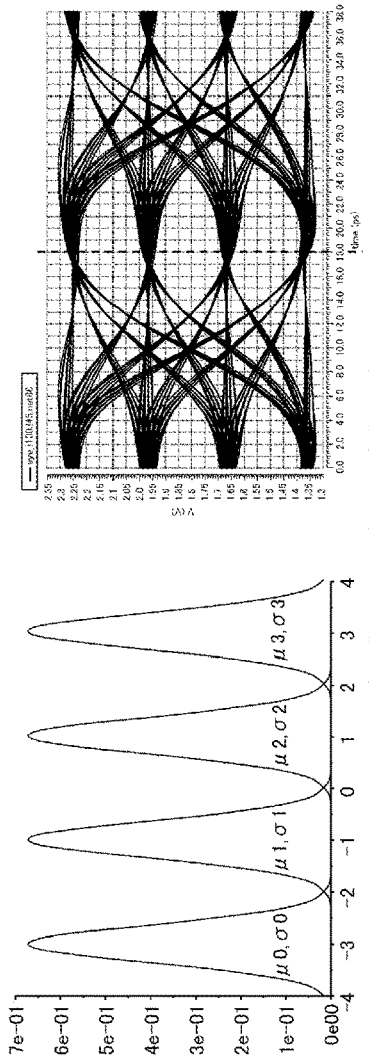

OUTPUT WAVEFORM (EYE WAVEFORM)

DISTRIBUTION FOR EACH LEVEL AT CERTAIN TIME

AMPLIFIER CIRCUIT

CROSS-REFERENCE TO RELATED APPLICATION

This application claims priority under 35 U.S.C. § 119 to Japanese Patent Application No. 2022-026414, filed on Feb. 24, 2022, the entire contents of which are incorporated herein by reference.

TECHNICAL FIELD

The present disclosure relates to an amplifier circuit.

BACKGROUND

There is known a differential amplifier circuit including a differential amplifier for amplifying a high-speed differential input signal and an emitter follower circuit for outputting an output of the differential amplifier as a differential output signal. Japanese Unexamined Patent Application Publication No. 2019-16982 discloses such a differential amplifier circuit.

SUMMARY

An amplifier circuit according to the present disclosure includes a first input terminal and a second input terminal to which a differential input signal is configured to be applied. The amplifier circuit includes a first output terminal and a second output terminal via which a differential output signal is configured to be output. The amplifier circuit includes a first transistor and a second transistor electrically connected respectively to the first input terminal and the second input terminal, the first transistor and the second transistor being configured to generate a differential current signal in accordance with the differential input signal. The amplifier circuit includes a current source electrically connected between a grounding wire and a pair of the first transistor and the second transistor, the current source being configured to supply a static current to the first transistor and the second transistor. The amplifier circuit includes a first load circuit and a second load circuit configured to generate a differential voltage signal as an amplified signal from the differential input signal. The amplifier circuit includes a first emitter-follower circuit and a second emitter-follower circuit, the first emitter-follower circuit being electrically connected between the first load circuit and the first output terminal, the second emitter-follower circuit being electrically connected between the second load circuit and the second output terminal, and the first emitter-follower circuit and the second emitter-follower circuit being configured to generate the differential output signal in accordance with the differential voltage signal. The amplifier circuit includes a first cascode transistor and a second cascode transistor, the first cascode transistor being electrically connected between the first transistor and the first load circuit, the second cascode transistor being electrically connected between the second transistor and the second load circuit. The amplifier circuit includes a first shunt transistor and a second shunt transistor, the first shunt transistor being electrically connected between the first transistor and the first emitter-follower circuit, the second shunt transistor being electrically connected between the second transistor and the second emitter-follower circuit. The differential current signal includes a first differential current and a second differential current, the first differential current flowing through the first cascode transistor and the second cascode transistor, and the second differential current flowing through the first shunt transistor and the second shunt transistor. The first load circuit and the second load circuit are configured to convert the first differential current into the differential voltage signal. The first emitter-follower circuit and the second emitter-follower circuit are configured to generate a first emitter-follower current and a second emitter-follower current. The first emitter-follower circuit and the second emitter-follower circuit are configured to generate the differential output signal by diverting the second differential current from the first emitter-follower current and the second emitter-follower current.

BRIEF DESCRIPTION OF THE DRAWINGS

FIG. 10 illustrates an example calculation of the SNR shown in FIG. 9.

DETAILED DESCRIPTION

Figure 1:
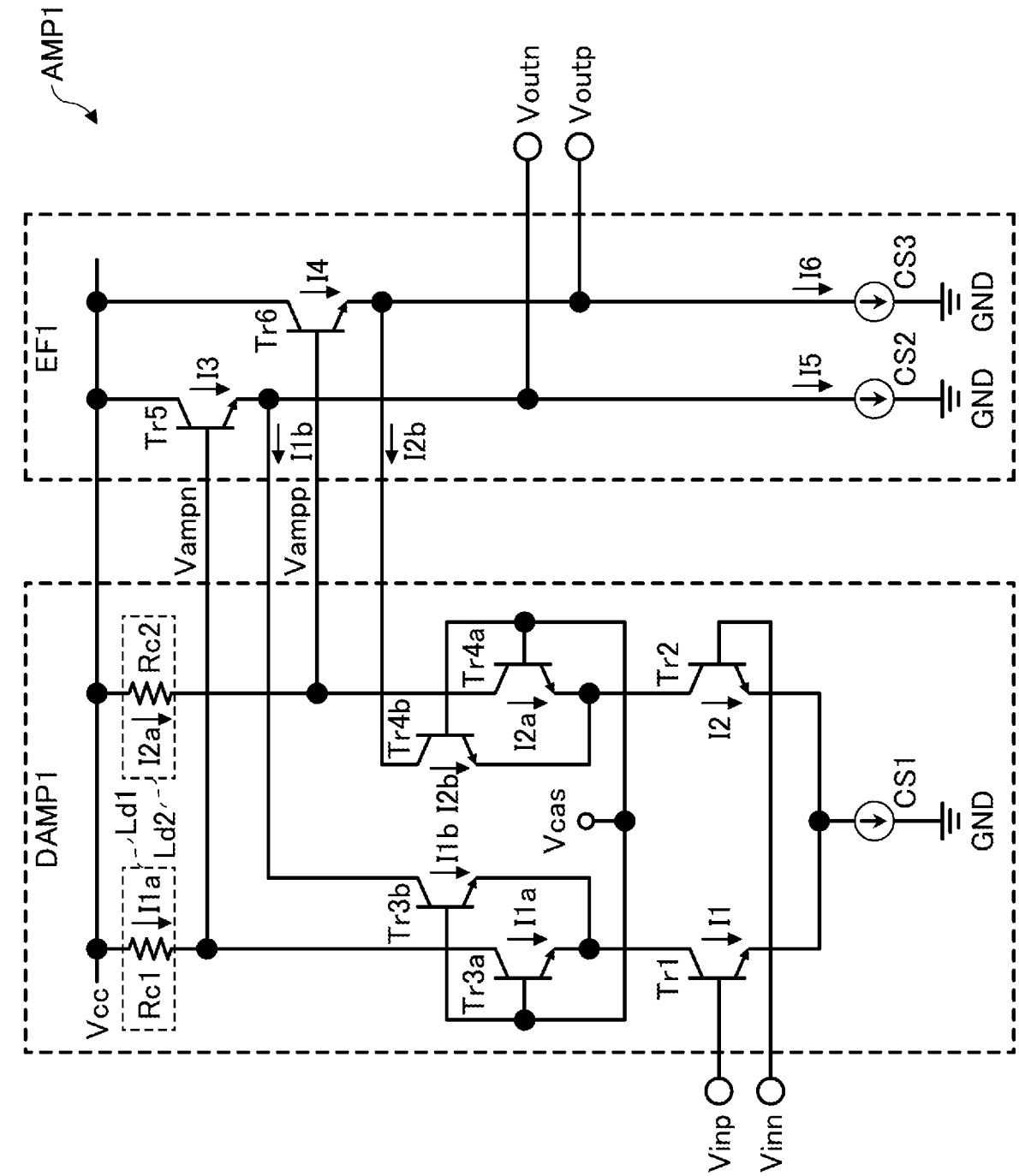
FIG. 1 is a circuit diagram illustrating an example of a configuration of an amplifier circuit according to a first embodiment.

Specific examples of the amplifier circuit of the present disclosure will be described below with reference to the drawings. In the following description, the same elements or corresponding elements are denoted by the same reference numerals, and description thereof may be omitted. In addition, the symbols of a terminal, a signal line, and a node are also used as symbols indicating a signal, a voltage, or a current. The base of the transistor is an example of a control terminal, the collector of the transistor is an example of an inflow terminal, and the emitter of the transistor is an example of an outflow terminal. The current and the current value are indicated by the same sign, and the current value may be simply referred to as the current. The present disclosure is not limited to these examples, but is defined by the scope of the claims, and is intended to include all modifications within the meaning and scope equivalent to the scope of the claims.

First Embodiment

[Circuit Configuration of Amplifier Circuit]

FIG. 1 is a circuit diagram illustrating an example of a configuration of an amplifier circuit according to the first embodiment. An amplifier circuit AMP1 shown in FIG. 1 is a differential amplifier circuit which receives a differential signal and outputs a differential signal. The differential amplifier circuit AMP1 includes a pair of input terminals Vinp and Vinn, a differential amplifier DAMP1, an emitter follower circuit EF1, and a pair of output terminals Voutp and Voutn. The input terminal Vinp is an example of a first input terminal, and the input terminal Vinn is an example of a second input terminal. The output terminal Voutn is an example of a first output terminal, and the output terminal Voutp is an example of a second output terminal. For example, the output terminals Voutn and Voutp are connected to respective capacitive loads. The capacitive loads may have the same capacitance. The capacitive load is, for example, a transistor (a field-effect transistor, a bipolar transistor, or the like) of an input part of a circuit in the next stage that operates according to the differential signal output from the amplifier circuit AMP1. The two transistors connected to the output terminals Voutn and Voutp may have the same input capacitance. In FIG. 1, the output terminal Voutn and the output terminal Voutp may be replaced with each other. For example, when the output terminal Voutn and the output terminal Voutp are interchanged with each other, the differential amplifier circuit AMP1 performs inverting amplification, not non-inverting amplification.

The differential amplifier DAMP1 includes a pair of switching transistors Tr1 and Tr2, a current source CS1, cascode transistors Tr3a and Tr4a, diverting transistors (shunt transistors) Tr3b and Tr4b, and load circuits Ld1 and Ld2. The load circuits Ld1 and Ld2 are, for example, resistance elements Rc1 and Rc2, respectively. The switching transistor Tr1 is an example of a first transistor, and the switching transistor Tr2 is an example of a second transistor. The cascode transistors Tr3a and Tr4a are examples of a first cascode transistor and a second cascode transistor, respectively. The diverting transistors Tr3b and Tr4b are examples of a first diverting transistor and a second diverting transistor, respectively. The load circuit Ld1 is an example of a first load circuit. The load circuit Ld2 is an example of a second load circuit.

The emitter follower circuit EF1 includes emitter follower transistors Tr5 and Tr6 and current sources CS2 and CS3. The emitter follower transistor Tr5 and the current source CS2 are examples of a first emitter follower circuit. The emitter follower transistor Tr6 and the current source CS3 are examples of a second emitter follower circuit. The current sources CS2 and CS3 are examples of an emitter-follower current source. Hereinafter, the switching transistors Tr1 and Tr2 are also simply referred to as transistors Tr1 and Tr2. The emitter follower transistors Tr5 and Tr6 are also simply referred to as transistors Tr5 and Tr6.

In a bipolar transistor, the emitter current is exactly the sum of the collector current and the base current. However, when the current amplification factor (grounded emitter current amplification factor) of the bipolar transistor is several tens or more, the base current is negligibly small with respect to the collector current, and therefore, in the following description, the emitter current is assumed to be equal to the collector current. When simply referring to a current with respect to a transistor, the current refers to an emitter current or a collector current in the case of a bipolar transistor, and further, the current refers to a drain current in the case of a field effect transistor.

In the differential amplifier DAMP1, one end of the load circuit Ld1 is connected to a power supply wiring Vcc, and the other end is connected to a base of the transistor Tr5. The power supply wiring Vcc supplies a power supply voltage Vcc and a power supply current to the differential amplifier DAMP1. One end of the load circuit Ld1 is an example of a first high potential terminal, and the other end of the load circuit Ld1 is an example of a first low potential terminal. The first high potential terminal has a potential higher than a potential of the first low potential terminal. One end of the load circuit Ld2 is connected to the power supply wiring Vcc, and the other end is connected to a base of the transistor Tr6. The one end of the load circuit Ld2 is an example of a second high potential terminal, and the other end of the load circuit Ld2 is an example of a second low potential terminal. The second high potential terminal has a potential higher than the potential of the second low potential terminal.

A base of the transistor Tr1 is electrically connected to the input terminal Vinp. A collector of the transistor Tr1 is electrically connected to both emitters of the transistors Tr3a and Tr3b. An emitter of the transistor Tr1 is electrically connected to the current source CS1. A base of the transistor Tr2 is electrically connected to the input terminal Vinn. A collector of the transistor Tr2 is electrically connected to both emitters of the transistors Tr4a and Tr4b. An emitter of the transistor Tr2 is electrically connected to the current source CS1 together with the emitter of the transistor Tr1. The current source CS1 is electrically connected between each emitter of the transistors Tr1 and Tr2 and the grounding wire GND, and supplies a static current (direct current) to the transistor Tr1 and the transistor Tr2. The grounding wire GND supplies a ground potential (0 V). The static current supplied by the current source CS1 is distributed to the collector current of the transistor Tr1 and the collector current of the transistor Tr2 in accordance with the base potential of the transistor Tr1 and the base potential of the transistor Tr2. The static current may be a constant current.

Each base of the transistors Tr3a, Tr3b, Tr4a, and Tr4b is electrically connected to a common bias terminal Vcas. A collector of the transistor Tr3a is electrically connected to the other end of the load circuit Ld1 and the base of the transistor Tr5. A collector of the transistor Tr3b is electrically connected to an emitter of the transistor Tr5. Both emitters of the transistors Tr3a and Tr3b are both electrically connected to the collector of the transistor Tr1. A collector of the transistor Tr4a is electrically connected to the other end of the load circuit Ld2 and the base of the transistor Tr6. A collector of the transistor Tr4b is electrically connected to an emitter of the transistor Tr6. Both emitters of the transistors Tr4a and Tr4b are electrically connected to the collector of the transistor Tr2.

The differential amplifier DAMP1 of this embodiment has two cascode transistors Tr3a and Tr4a, the emitters of which are connected to each other, and two diverting transistors Tr3b and Tr4b, the emitters of which are connected to each other. For example, the transistors Tr3a and Tr3b are configured such that the I1a:I1b ratio, i.e., a ratio between currents (collector currents) I1a and I1b, is 5:1, where the current I1a flows from the collector to the emitter of the transistor Tr3a and the current I1b flows from the collector to the emitter of the transistor Tr3b. Similarly, the transistors Tr4a and Tr4b are configured such that the I2a:I2b ratio, a ratio between the currents (collector currents) I2a and I2b, is 5:1, where the current I2a flows from the collector to the emitter of the transistor Tr4a and the current I2b flows from the collector to the emitter of the transistor Tr4b. A differential current (differential current signal) I1a, I2a is an example of a first differential current, and a differential current (differential current signal) I1b, I2b is an example of a second differential current. For example, the current I1a is a positive phase component of the differential current signal I1a, I2a and the current I2a is a negative phase component of the differential current signal I1a, I2a. For example, the current I1b is a positive phase component of the differential current signal I1b, I2b and the current I2b is a negative phase component of the differential current signal I1b, I2b. The arrows shown in FIG. 1 indicate the current flows.

It should be noted that the current ratio I1a/I1b and the current ratio I2a I2b are determined in consideration of an amplification factor (voltage gain) of the differential amplifier circuit AMP1 and waveform shapes of a differential output signal Voutp, Voutn that change according to changes in the differential input signal Vinp, Vinn. The differential output signal Voutp, Voutn includes a positive phase component (positive phase output signal) Voutp and a negative phase component (negative phase output signal) Voutn. The positive phase output signal Voutp and the negative phase output signal Voutn are complementary signals to each other, and the positive phase output signal Voutp has a phase offset by 180 degrees from that of the negative phase output signal Voutn. For example, the positive phase output signal Voutp is output from the output terminal Voutp, and the negative phase output signal Voutn is output from the output terminal Voutn. The current ratio, I1a:I1b, and the current ratio, I2a:I2b, may be designed to be other than 5:1 as long as a desired amplification factor and desired waveform shapes of the differential output signals Voutp and Voutn are obtained. Hereinafter, the current ratio is also referred to as a division ratio.

In the emitter follower circuit EF1, a collector of the transistor Tr5 is connected to the power supply wiring Vcc. The power supply wiring Vcc supplies the power supply voltage Vcc and a power supply current to the emitter follower circuit EF1. The emitter of the transistor Tr5 is connected to the output terminal Voutn and the current source CS2. A collector of transistor Tr6 is connected to the power supply wiring Vcc. The emitter of the transistor Tr6 is connected to the output terminal Voutp and the current source CS3. The current source CS2 is electrically connected between the emitter of the transistor Tr5 and the grounding wire GND, and supplies a static current (direct current). The current source CS3 is electrically connected between the emitter of the transistor Tr6 and the grounding wire GND, and supplies a static current (direct current).

In the following description, the ground potential is used as the reference potential for the "potential". Further, with respect to the "voltage", the reference potential is treated as the ground potential unless otherwise specified. Therefore, "potential" and "voltage" may be considered to be equivalent. For example, the term "potential" may be used to represent the height of a potential from the reference potential, and the term "voltage" may be simply used to represent a voltage as a physical quantity.

In the differential amplifier circuit AMP1 shown in FIG. 1, the transistors Tr1 and Tr2 generate a differential current signal I1, I2 in accordance with the differential input signal received at the input terminals Vinp and Vinn. The sum of one component I1 of the differential current signal I1, I2, and the other component I2 of the differential current signal I1, I2, is equal to a value of the static current supplied by the current source CS1. Therefore, for example, when the base voltage of the transistor Tr1 is higher than the base voltage of the transistor Tr2, the current signal I1 increases and the current signal I2 decreases. When the base voltage of the transistor Tr1 is lower than the base voltage of the transistor Tr2, the current signal I1 decreases and the current signal I2 increases. The current signal I1 is divided into a current signal I1a flowing through the transistor Tr3a and a current signal I1b flowing through the transistor Tr3b in accordance with the current ratio of I1a:I1b. The current signal I2 is divided into a current signal I1a flowing through the transistor Tr4a and a current signal I2b flowing through the transistor Tr4b in accordance with the current ratio, I2a:I2b. The transistor Tr2 preferably has the same electrical characteristics as the electrical characteristics of the transistor Tr1. "The same" means that values of parameters indicating electrical characteristics may be different from each other within a practically allowable range of manufacturing variation.

Since the collector of the transistor Tr3b is connected to the emitter of the transistor Tr5, a part of an emitter-follower current I3 output from the emitter of the transistor Tr5 is diverted as the current signal I1b, which flows into the collector of the transistor Tr3b. Similarly, since the collector of the transistor Tr4b is connected to the emitter of the transistor Tr6, a part of an emitter-follower current I4 output from the emitter of the transistor Tr6 is diverted as the current signal I2b, which flows into the collector of the transistor Tr4b. That is, a pair of the diverting transistors Tr3b and Tr4b subtracts the differential current signal I1b, I2b from the differential emitter-follower current I3, I4 to generate the differential output signal Voutp, Voutn. The differential emitter-follower current I3, I4 are an example of a pair of emitter-follower currents.

The load circuits Ld1 and Ld2 generate a differential voltage signal Vampp, Vampn to be input to the bases of the transistors Tr5 and Tr6 in accordance with the differential current signal I1a, I2a. In other words, the load circuits Ld1 and Ld2 convert the differential current signal I1a, I2a into the differential voltage signal Vampp, Vampn. The differential voltage signal Vampp, Vampn becomes an output signal of the differential amplifier DAMP1. The differential voltage signal Vamp, Vampn has a positive phase component (positive phase voltage signal) Vampp and a negative phase component (negative phase voltage signal) Vampn. Like the other differential signals, the positive phase voltage signal Vampp and the negative phase voltage signal Vampn are complementary signals to each other, and the positive phase voltage signal Vampp has a phase offset by 180 degrees from that of the negative phase voltage signal Vampn. For example, the negative phase voltage signal Vampn is input to the base of the transistor Tr5, and the positive phase voltage signal Vampp is input to the base of the transistor Tr6. The transistor Tr5 and the current source CS2 and the transistor Tr6 and the current source CS3 generate the differential output signal Voutp, Voutn at the emitters of the transistors Tr5 and Tr6 in accordance with the differential voltage signal Vampp, Vampn received at the bases of the transistors Tr5 and Tr6. The load circuit Ld2 preferably has the same electrical characteristics as the electrical characteristics of the load circuit Ld1. For example, the load circuit Ld2 may have the same circuit configuration as that of the load circuit Ld1. In addition, when the load circuits Ld1 and Ld2 are the resistance elements Rc1 and Rc2, respectively, the resistance element Rc2 may have a resistance value equal to a resistance value of the resistance element Rc1. Here, "the same" includes a case where values are different from each other within a practically allowable range.

In a steady state in which one of the input terminals Vinp and Vinn is maintained at a high-level voltage or a low-level voltage (voltages of complementary levels) and the other of the input terminals Vinp and Vinn is maintained oppositely at a low-level voltage or a high-level voltage, the direct current hardly flows through external loads (load capacitances) connected to the output terminals Voutn and Voutp. More specifically, in the differential input signal Vinp, Vinn input to the input terminals Vinp and Vinn, for example, when the positive phase component (positive phase input signal) Vinp is at the high-level voltage (peak voltage), the negative phase component (negative phase input signal) Vinn is at the low-level voltage (bottom voltage) lower than the high level voltage, and when the positive phase input signal Vinp is at the low-level voltage, the negative phase input signal Vinn is at the high-level voltage. In the differential output signal Voutp, Voutn output from the output terminals Voutn and Voutp, when the positive phase component (positive phase output signal) Voutp is at the high level voltage, the negative phase component (negative phase output signal) Voutn is at the low level voltage, and oppositely when the positive phase output signal Voutp is at the low level voltage, the negative phase output signal Voutn is at the high level voltage. A part of the emitter-follower current I3 is diverted to the diverting transistor Tr3*b* as the diverted current (collector current) I1*b*, and a part of the emitter-follower current I4 is diverted to the diverting-transistor Tr4*b* as the diverted current (collector current) I2*b*. However, since a deviation in the base-emitter voltage due to the diverting of the differential current signal I1*b*, I2*b* from the emitter currents I3 and I4 of the transistors Tr5 and Tr6 is small, a pair of the diverted currents I1*b*, I2*b* does not affect the operation of the differential amplifier circuit AMP1.

The differential current signal I1, I2 are divided into the differential current signal I1*a*, I2*a* flowing through the transistors Tr3*a* and Tr4*a* and the differential current signal I1*b*, I2*b* flowing through the transistors Tr3*b* and Tr4*b*. Since the differential current signal I1*b*, I2*b* does not contribute to the generation of the differential voltage signal Vampp, Vampn input to the bases of the transistors Tr5 and Tr6, the gain of the differential amplifier circuit DAMP1 is decreased as compared with the case where the differential current signal I1, I2 are not divided. However, by increasing the transistor sizes of both the transistors Tr3*a* and Tr4*a*, it is possible to suppress (compensate) the decrease in the gain.

[Operation of Amplifier Circuit]

Figure 2:
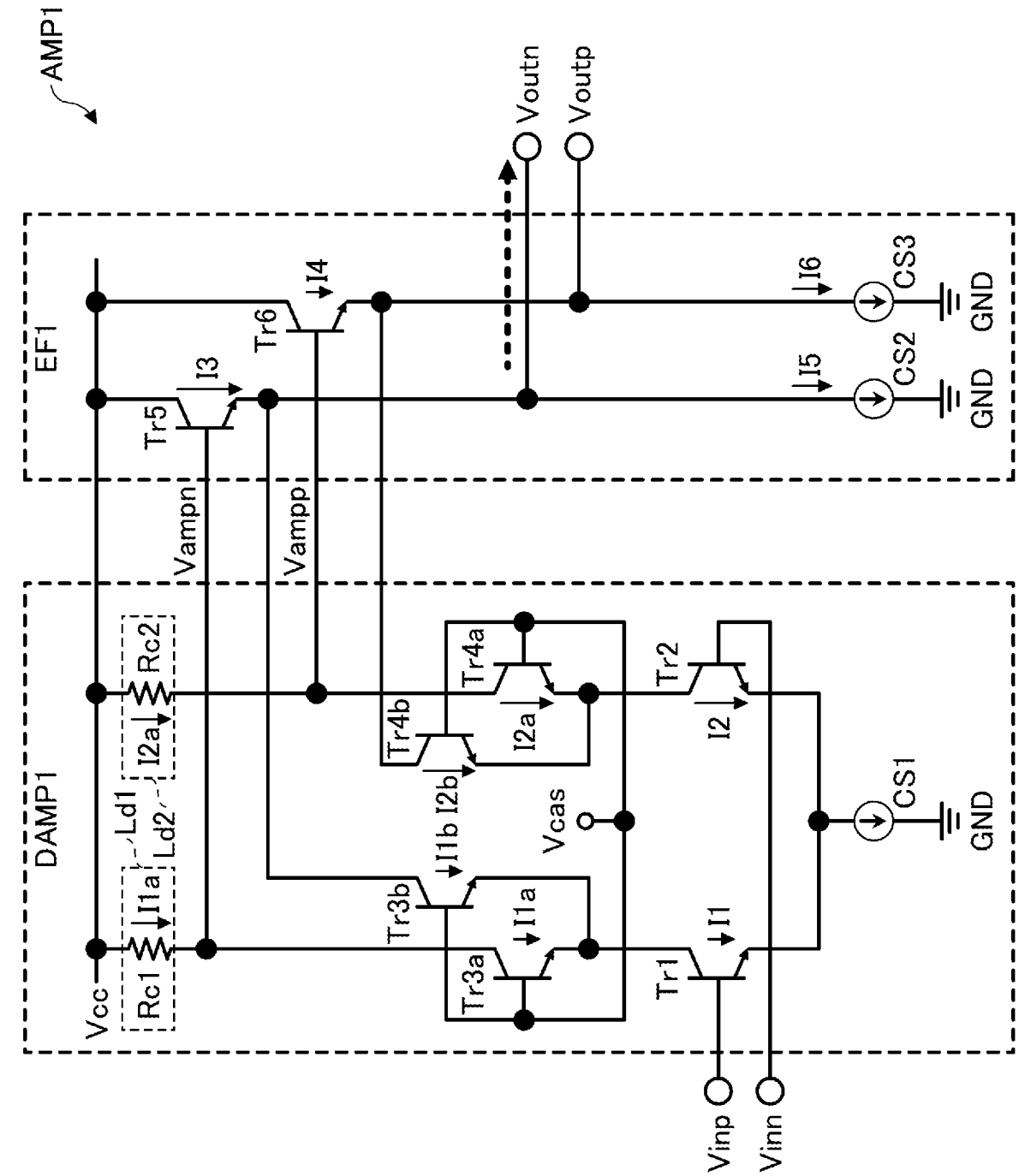
FIG. 2 is an explanatory diagram illustrating an example of an operation when an input signal Vinp input to an input terminal Vinp changes from a high-level to a low-level in the differential amplifier circuit of FIG. 1.

FIG. 2 is an explanatory diagram illustrating an example of an operation when the voltage of the input signal Vinp input to the input terminal Vinp complementarily changes from a high-level to a low-level in the differential amplifier circuit AMP1 of FIG. 1. When the voltage of the input signal Vinp input to the input terminal Vinp changes from the high-level to the low-level, the voltage of the input signal Vinn input to the input terminal Vinn complementarily changes from the low-level to the high-level.

For example, in the differential input signal Vinp, Vinn, the positive-phase input signal Vinp and the negative-phase input signal Vinn are complementary signals to each other, and the positive phase input signal Vinp has a phase different by 180 degrees from the phase of the negative phase input signal Vinn. More specifically, when the voltage of the positive phase input signal Vinp increases, the voltage of the negative phase input signal Vinn decreases, and oppositely when the voltage of the positive phase input signal Vinp decreases, the voltage of the negative phase input signal Vinn increases. When the voltage of the positive phase input signal Vinp reaches the maximum value (peak value), the voltage of the negative phase input signal Vinn reaches the minimum value (bottom value), and oppositely when the voltage of the positive phase input signal Vinp reaches the bottom value, the voltage of the negative phase input signal Vinn reaches the peak value. It is preferable that the positive phase input signal Vinp has an amplitude equal to an amplitude of the negative phase input signal Vinn, and has an average value equal to an average value (direct current component) of the negative phase input signal Vinn. Here, the amplitude corresponds to the difference between the peak value and the bottom value. Not only in the differential input signal Vinp, Vinn but also in the differential output signal Voutp, Voutn or other differential signal, a pair of a positive phase component (positive phase signal) and a negative phase component (negative phase signal) constituting the differential signal has the same relationship as the differential input signals Vinp and Vinn. For example, in the differential output signal Voutp, Voutn, the positive phase output signal Voutp and the negative phase output signal Voutn are complementary signals to each other. Therefore, in the following description, only the positive phase signal will be described with respect to the change of the differential signal, and the description for the negative phase signal may be omitted.

When the voltage of the input signal Vinp changes from the high-level to the low-level, the current (collector current) I1 flowing through the transistor Tr1 decreases. When the voltage of the signal Vinp input to the input terminal Vinp changes from the high-level to the low-level, the voltage of the input signal Vinn input to the input terminal Vinn complementarily changes from the low-level to the high-level. As described in FIG. 1, the current I1 is divided into the currents I1, b, and the current ratio, I1*a*:I1*b*, is, for example, 5:1. The currents I1*a* and I1*b* each decrease as the current I1 decreases. In FIG. 2, the length of the arrow indicating the current relatively indicates the current value. An arrow shorter than the arrow in FIG. 1 indicates a relative decrease in current value. An arrow longer than the arrow in FIG. 1 indicates a relative increase in current value.

The decrease in the current I1*a* causes the voltage drop of the resistance element Rc1 in the load circuit Lc1 to decrease, and the base voltage of the transistor Tr5 of the emitter follower circuit EF1 rises so as to approach the power supply voltage Vcc. Since the external load (capacitance) connected to the output terminal Voutn holds the potential until charging starts, a base-emitter voltage Vbe of the transistor Tr5 temporarily increases. The transistor Tr5 increases the current I3 in accordance with an increase in the base-emitter voltage Vbe. As will be described later, the external load (capacitance) is charged by the increased current I3. At this time, since a part of the current I3 is diverted as the diverted current I1*b*, the current that is output from the output terminal Voutn and charges the external load (capacitance) is decreased compared to the case where the current I1 is not divided into the currents I1*a* and I1*b*.

Figure 9:
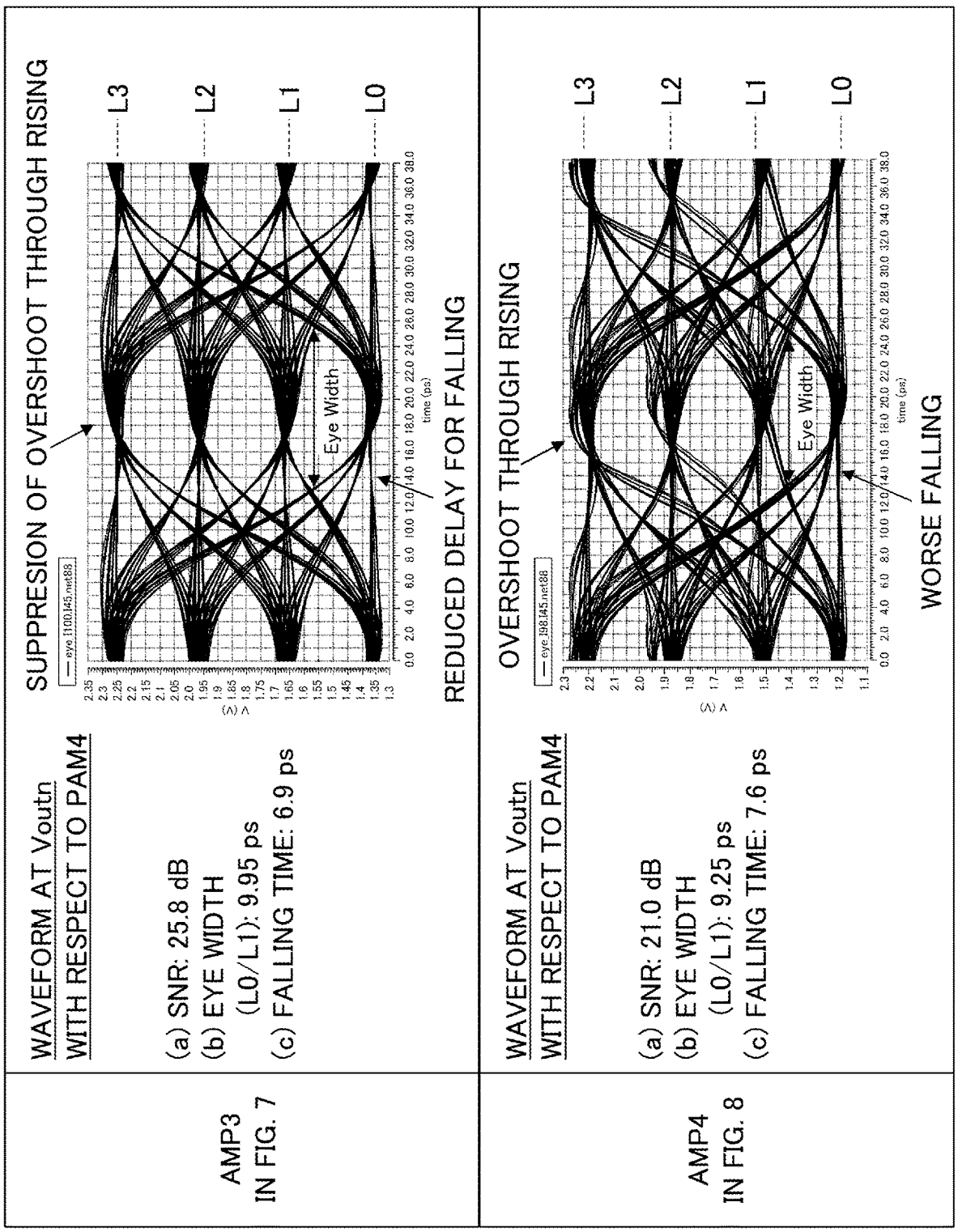
FIG. 9 is a waveform diagram illustrating an example of operation of the amplifier circuit of FIG. 7 and the amplifier circuit of FIG. 8.

The current I3 flowing through the transistor Tr5 increases from the sum I5+I1*b* of the current I5 flowing through the current source CS2 and the current I1*b* flowing through the transistor Tr3b. Then, a current represented by a difference (I3−I5−I1b) between the current I3 and the sum I5+I1b of the currents I5 and I1b flows from the output terminal Voutn toward the external load (load capacitance) (see a broken-line arrow in FIG. 2). Since the external load (load capacitance) is charged by the output current (charging current) flowing from the output terminal Voutn to the external load (load capacitance) (not shown), the potential of the external load (load capacitance) rises. Therefore, the voltage of the output terminal Voutn increases, for example, changes from the low-level to the high-level. An example of the waveform of the output signal Voutn when the input signal Vinp changes from the high-level to the low-level is shown in FIG. 9.

Since the current I1a is smaller than the current I1, the voltage drop occurring in the resistance element Rc1 of the load circuit Ld1 is smaller than that in the case where the current I1 is not divided into the currents I1a and I1b, so that the gain of the differential amplifier DAMP1 is decreased. However, since the high-level of the base voltage of the transistor Tr5 is not affected by the variation of the voltage drop of the resistance element Rc1 of the load circuit Ld1, the current I3 easily flows into the external load connected to the output terminal Voutn from the transistor Tr5. Thus, the division of the current I1 does not reduce the charging rate of the differential amplifier circuit AMP1. In addition, as compared with the case where the current I1 is not divided into the currents I1a and I1b, an excessive part in the charging current for charging the external load (capacitance) is reduced by the current I1b. Therefore, it is possible to reduce an overshoot at rising edges of the output signal Voutn.

Figure 3:
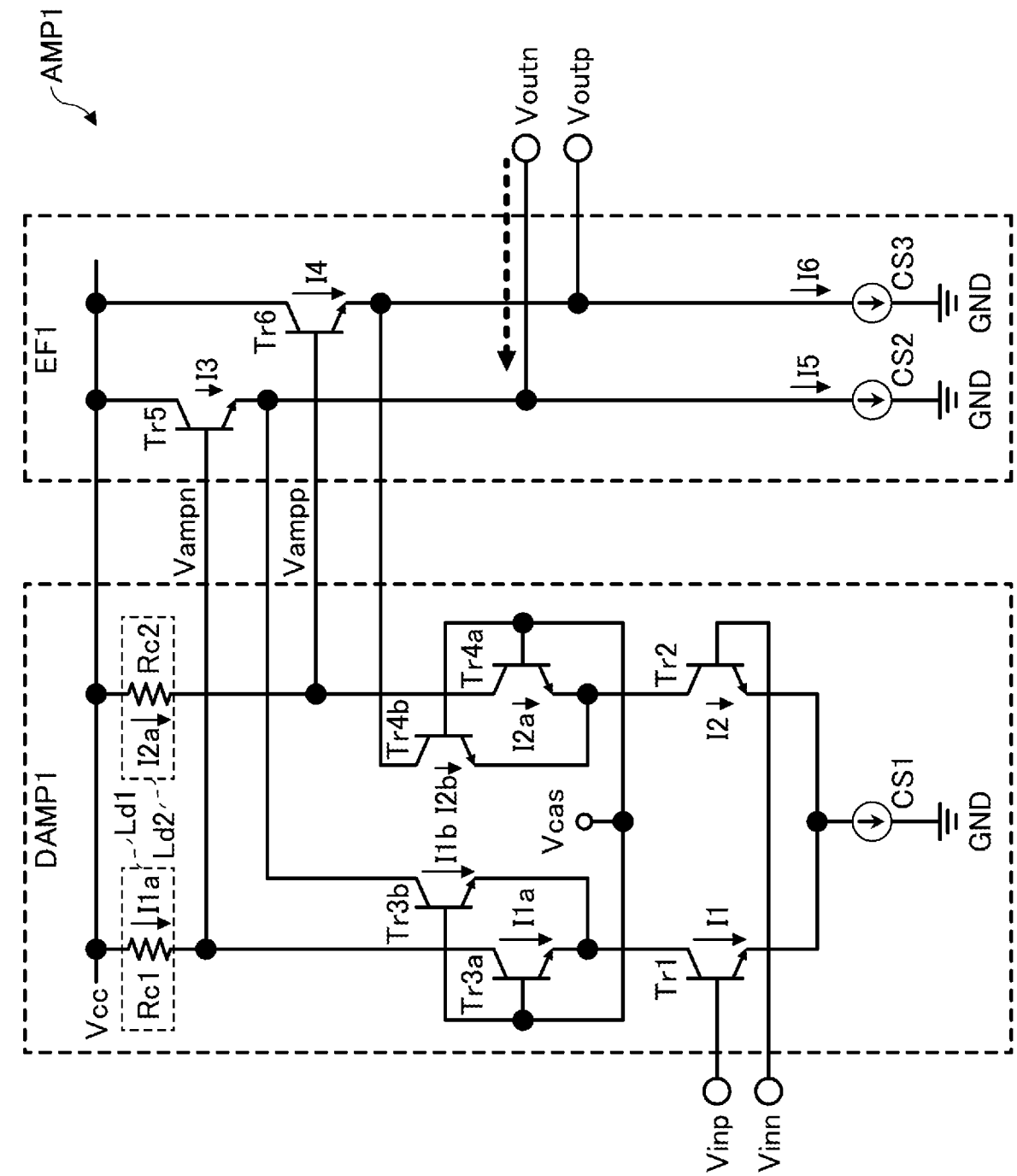
FIG. 3 is an explanatory diagram illustrating an example of an operation when an input signal Vinp input to an input terminal Vinp changes from a low-level to a high-level in the differential amplifier circuit of FIG. 1.

FIG. 3 is an explanatory diagram showing an example of an operation when the input signal Vinp input to the input terminal Vinp changes from a low level to a high level in the differential amplifier circuit AMP1 of FIG. 1. When the voltage of the signal Vinp input to the input terminal Vinp changes from the low level to the high level, the voltage of the input signal Vinn input to the input terminal Vinn complimentarily changes from the high level to the low level.

The operation when the input signal Vinn changes from the low level to the high level is the same as the operation when the input signal Vinp changes from the high level to the low level described with reference to FIG. 2. Therefore, the operation when the input signal Vinp changes from a low level to a high level will be described with reference to FIG. 3.

In FIG. 3, the length of an arrow indicating a current relatively indicates a current value as in FIG. 2. An arrow shorter than the corresponding arrow in FIG. 1 indicates a relative decrease in current value. An arrow longer than the corresponding arrow in FIG. 1 indicates a relative increase in current value. When the voltage of the input signal Vinp changes from the low level to the high level, the current (collector current) I1 flowing through the transistor Tr1 increases. Each of the currents I1a and I1b increases as the current I1 increases. The increase in the current I1a causes the voltage drop of the resistance element Rc1 in the load circuit Ld1 to increase, and the base voltage of the transistor Tr5 in the emitter follower circuit EF1 decreases from the power supply voltage Vcc toward the ground potential. Since the external load (load capacitance) connected to the output terminal Voutn holds the potential until discharge starts, the base-emitter voltage Vbe of the transistor Tr5 temporarily decreases. The transistor Tr5 decreases the current I3 in accordance with a decrease in the base-emitter voltage Vbe. As will be described later, when the current I3 decreases, the external load (load capacitance) is discharged. At this time, since a part of the current I3 is diverted as the diverted current I1b, the current that externally flows into the output terminal Voutn and discharges the external load (capacitance) is increased compared to the case where the current I1 is not divided into the currents I1a and I1b.

The change of the input signal Vinp from the low level to the high level increases the diverted current I1b. The current flowing from the transistor Tr5 toward the current source CS2 is reduced by the diverted current I1b, which flows into the transistor Tr3b, from the current I3, which flows through the transistor Tr5. Then, the output current (discharge current) indicated by the difference (I5−I3+I1b) between the current I5 and the current I3−I1b flowing from the transistor Tr5 toward the current source CS2 flows from the external load (load capacitance) toward the current source CS2 via the output terminal Voutn. That is, when the input signal Vinp changes from the low level to the high level, the current for discharging the charge of the external load (load capacitance) can be increased by the diverted current I1b. Therefore, as compared with the case where the current I1 is not divided into the currents I1a and I1b, the potential of the external load (load capacitance) can fall at a relatively higher speed, and the differential amplifier circuit AMP1 can be operated at a higher speed. The potential of the external load corresponds to the voltage of the output signal Voutn.

As described above, compared with the case where the current I1 is not divided into the currents I1a and I1b, the discharge of the external load (load capacitance) can be accelerated by subtracting the diverted current I1b from the current I3, and the delay of the fall of the output signal of the emitter follower circuit EF1 can be reduced. As a result, the failing edge (the transition from a high level to a low level) of the output signal Voutn with respect to the rising of the input signal Vinp can be improved. An example of the waveform of the output signal Voutn when the input signal Vinp changes from a low level to a high level is shown in FIG. 9.

Figure 4:
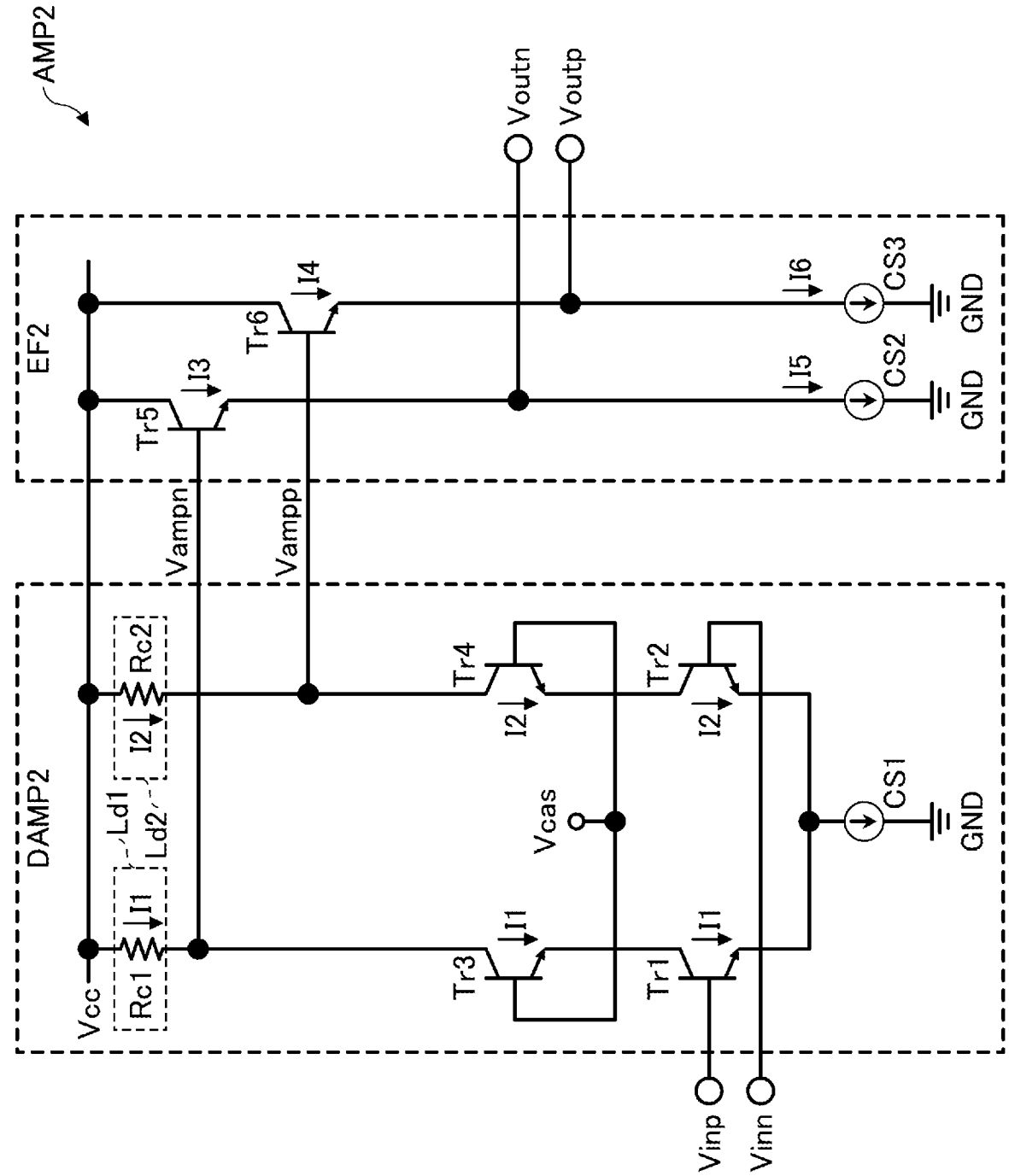
FIG. 4 is a circuit diagram illustrating an example of a configuration of another amplifier circuit.

FIG. 4 is a circuit diagram showing an example of a configuration of another amplifier circuit. The amplifier circuit AMP2 shown in FIG. 4 is a differential amplifier circuit which receives a differential signal and outputs a differential signal. The differential amplifier circuit AMP2 is an example for comparison with the differential amplifier circuit AMP1, and has the same configuration as that of the differential amplifier circuit AMP1 of FIG. 1 except that it does not have the transistors Tr3b and Tr4b and has transistors Tr3 and Tr4 instead of the transistors Tr3a and Tr4a. The differential amplifier circuit AMP2 includes a differential amplifier DAMP2 and an emitter follower circuit EF2. The arrows shown in FIG. 4 indicate the direction of current flow. The length of the arrows is intended to indicate a relative magnitude relation in comparison with the other figures.

For example, the current (collector current) I1 flowing through the transistor Tr3 is set to be equal to the sum of the currents I1a and I1b, which flow through the transistors Tr3a and Tr3b shown in FIG. 1, respectively. The current (collector current) I2 flowing through the transistor Tr4 is set to be equal to the sum of the currents I1a and I2b, which flow through the transistors Tr4a and Tr4b shown in FIG. 1, respectively.

Figure 5A:
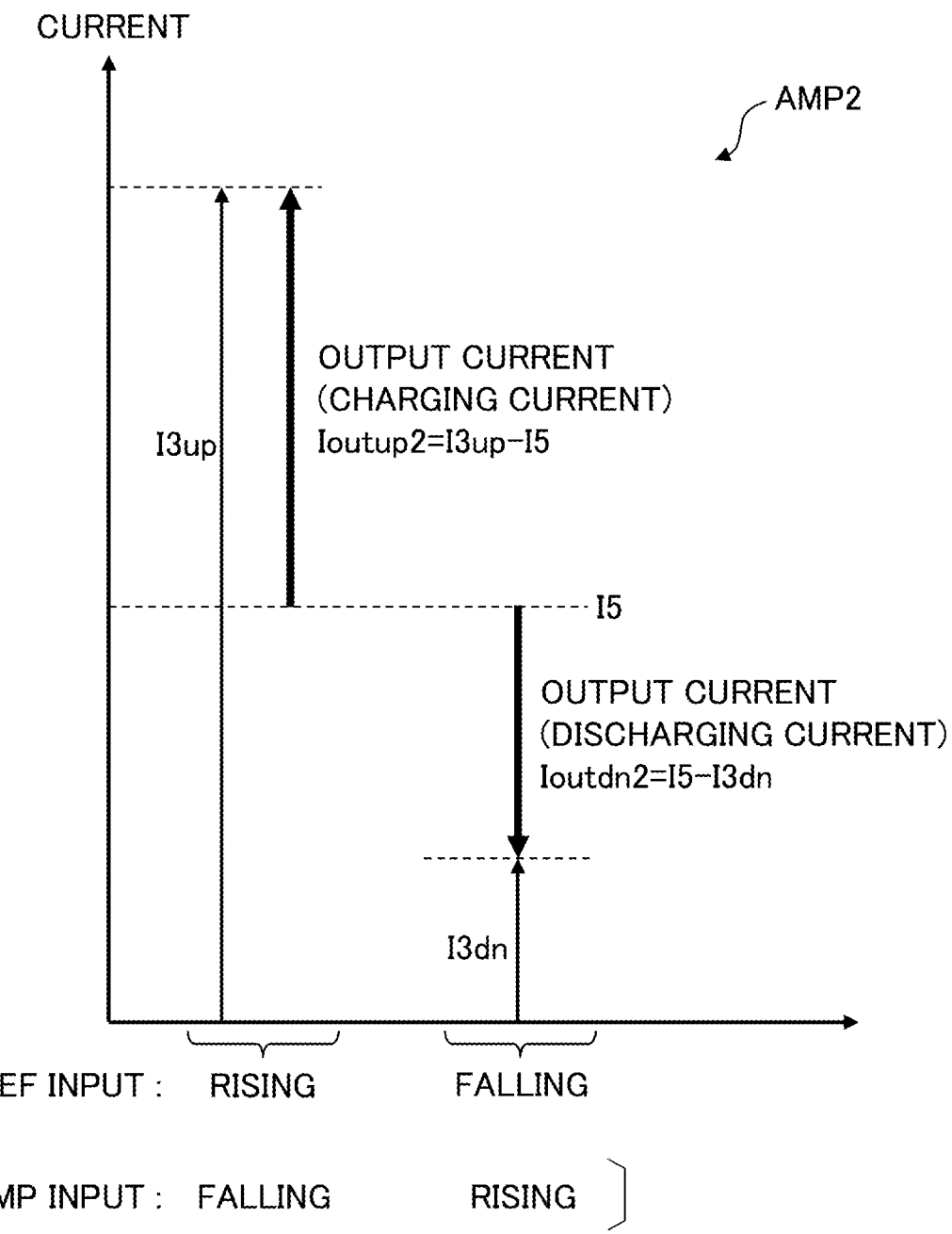
FIG. 5A is a diagram illustrating an example of an output current of the amplifier circuit of FIG. 4.
Figure 5B:
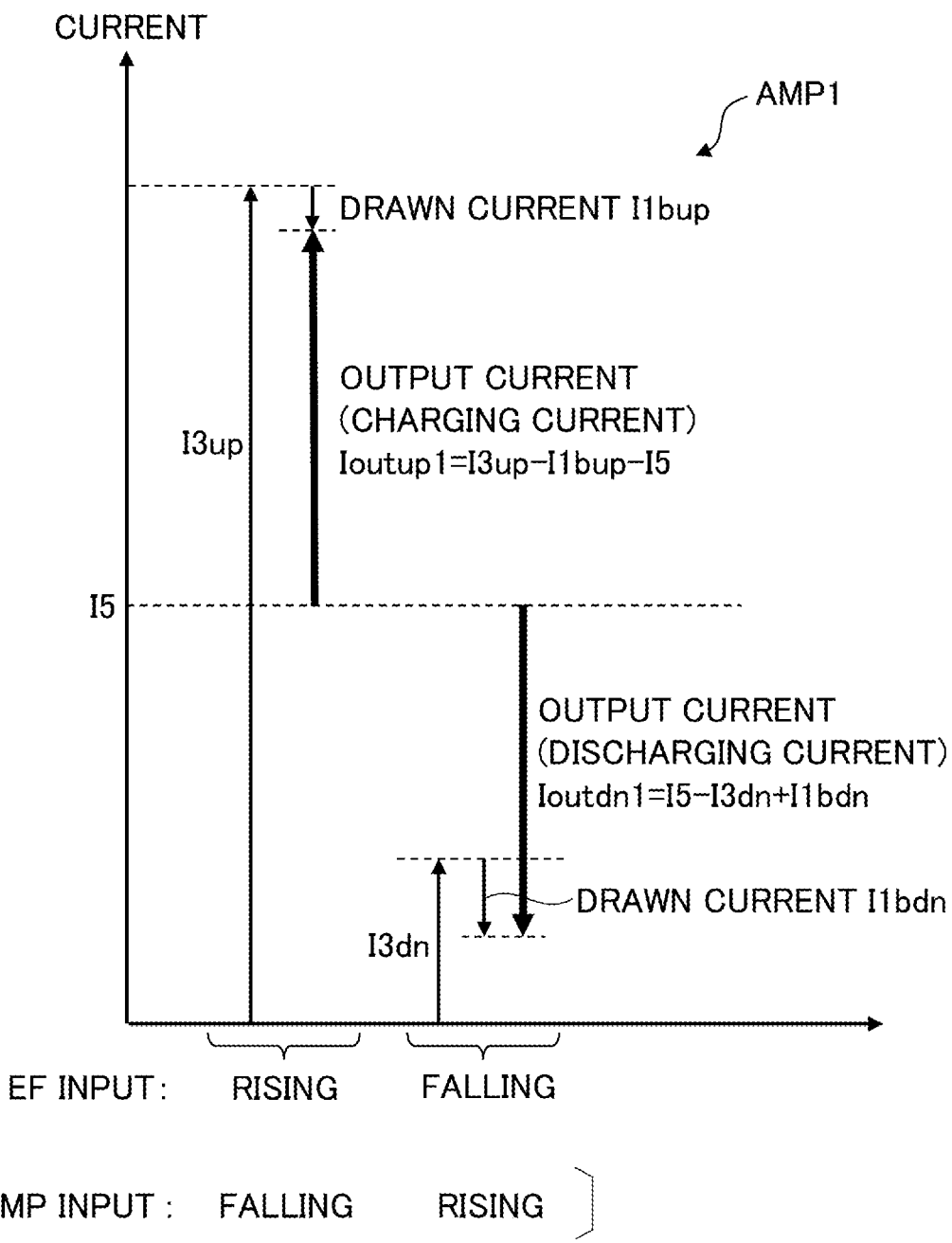
FIG. 5B is a diagram illustrating an example of an output current of the amplifier circuit of FIG. 1.

FIG. 5a is an explanatory diagram showing an example of the output current of the differential amplifier circuit AMP2 of FIG. 4. FIG. 5B illustrates an example of the output current of the differential amplifier circuit AMP1 of FIG. 1.

Although only the output current flowing through the output terminal Voutn is shown in FIGS. 5A and 5B for the sake of simplicity, the output current flowing through the output terminal Voutp is the same as that of FIGS. 5A and 5B except that the rising and falling of the differential input signals signal Vinp, Vinn should be exchanged to each other. The output current flowing through the output terminal Voutp may be obtained by replacing the currents I3$up$, I3$dn$, and I5 in FIG. 5 with currents I4$up$, I4$dn$, and I6, respectively. The current I3$up$ is a current flowing through the transistor Tr5 when the base voltage of the transistor Tr5 rises (increases). The current I3$dn$ is a current flowing through the transistor Tr5 when the base voltage of the transistor Tr5 falls (decreases). The current I4$up$ is a current flowing through the transistor Tr6 when the base voltage of the transistor Tr6 rises (increases). The current I4$dn$ is a current flowing through the transistor Tr6 when the base voltage of the transistor Tr6 falls (decreases). The transistor Tr6 preferably has the same electrical characteristics as those of the transistor Tr5. The current I6 is preferably set to the same current value as the current value of the current I5.

In the differential amplifier circuits AMP2 and AMP1, a static current I5 flows through the current source CS2. The base of the transistor Tr5 serves as the input of the emitter follower circuit EF1. The negative phase component Vampn of the differential voltage signal Vampp, Vampn generated by the differential amplifier DAMP1 is input to the base of the transistor Tr5. The base voltage of the transistor Tr5 rises in response to the fall of the base voltage of the transistor Tr1, and falls in response to the rise of the base voltage of the transistor Tr1. When the base voltage of the transistor Tr5 rises, a current I3$up$ larger than the current I5 flows through the transistor Tr5. When the base voltage of the transistor Tr5 falls, a current I3$dn$ smaller than the current I5 flows through the transistor Tr5.

In the differential amplifier circuit AMP2 in which the current I1 of the transistor Tr1 is not divided into the currents I1$a$ and I1$b$, when the base voltage of the transistor Tr5 rises, the difference I3$up$–I5 between the current I3$up$ and the current I5 is output from the output terminal Voutn as the output current Ioutup2. The output current Ioutup2 is a charging current for charging the external load (load capacitance) connected to the output terminal Voutn.

Further, in the differential amplifier circuit AMP2, when the base voltage of the transistor Tr5 falls, the difference I5–I3$dn$ between the current I5 and the current I3$dn$ externally flows into the output terminal Voutn as the output current Ioutdn2. The output current Ioutdn2 is a discharge current for discharging the external load (load capacitance) connected to the output terminal Voutn. As shown in FIG. 5A, the differential amplifier circuit AMP2 is in an unbalanced state in which the charging current Ioutup2 is excessively larger than the discharging current Ioutdn2. For example, when the load capacitance is charged and discharged, the speed of charging and discharging changes depending on each magnitude of the charging current and the discharging current, and thus discharging becomes slower than charging. Thus, the voltage waveform of the negative phase component (negative phase output signal) Voutn has a falling edge that is slower than a rising edge. In other words, the voltage waveform has a fall time larger than a rise time.

On the other hand, in the differential amplifier circuit AMP1 that divides the current I1 of the transistor Tr1 into the currents I1$a$ and I1$b$, when the base voltage of the transistor Tr5 rises, the difference between the current I5 and the current I3$up$–I1$bup$ obtained by subtracting the diverted current I1$bup$ from the current I3$up$ becomes the output current Ioutup1. That is, the current I3$up$–I5–I1$bup$ is outputted as the output current Ioutup1 from the output terminal Voutn to the external load (load capacitance). The output current Ioutup1 is a charging current for charging an external load (load capacitance) connected to the output terminal Voutn.

Further, in the differential amplifier circuit AMP1, when the base voltage of the transistor Try falls, the difference between the current I5 and the current I3$dn$–I1$bdn$ obtained by subtracting the diverted current I1$bdn$ from the current I3$dn$ becomes the output current Ioutdn1. Then, the current (I5–I3$dn$+I1$bdn$) flows into the output terminal Voutn from the external load (load capacitance) as the output current Ioutdn1. The output current Ioutdn1 is a discharge current for discharging an external load (load capacitance) connected to the output terminal Voutn.

As shown in FIG. 5B, the output current Ioutup1 of the differential amplifier circuit AMP1 is reduced from the output current Ioutup2 of the differential amplifier circuit AMP2 (see FIG. 5A) by the diverted current I1$bup$. As a result, in the differential amplifier circuit AMP1, the charging current is appropriately reduced as compared with the differential amplifier circuit AMP2, and it is possible to relax an overshoot at the rising edge of the output signal Voutn.

Also, the output current Ioutdn1 of the differential amplifier circuit AMP1 shown in FIG. 5B is increased by the diverted current I1$bdn$ from the output current Ioutup2 of the differential amplifier circuit AMP2 (see FIG. 5A). As a result, in the differential amplifier circuit AMP1, the discharge current is increased as compared with the differential amplifier circuit AMP2, and the fall delay of the output signal Voutn can be improved. In other words, the differential amplifier circuit AMP1 can improve the balance (i.e., the difference) between the output currents Ioutup1 and Ioutdn1 compared to the differential amplifier circuit AMP2, and can reduce the difference between the rising delay and the falling delay of the output signal Voutn. As a result, the differential amplifier circuit AMP1 reduces the charging current Ioutup1 from the charging current Ioutup2 and increases the discharging current Ioutdn1 from the discharging current Ioutdn2, thereby improving the unbalanced state of the differential amplifier circuit AMP2. The current I1 when the DAMP input falls, namely when the voltage Vinp changes from the high level to the low level) (see FIG. 2) is smaller than the current I1 when the DAMP input rises, namely when the voltage Vinp changes from the low level to the high level) (see FIG. 3). As the current I1 increases, the current I1$b$ divided from the current I1 at a predetermined current ratio also increases. As the current I1 decreases, the current I1$b$ divided from the current I1 at a predetermined current ratio also decreases. Accordingly, the diverted current I1$bup$ is smaller than the diverted current I1$bdn$.

[Layout Example of Cascode Transistor and Diverting Transistor]

Figure 6A:
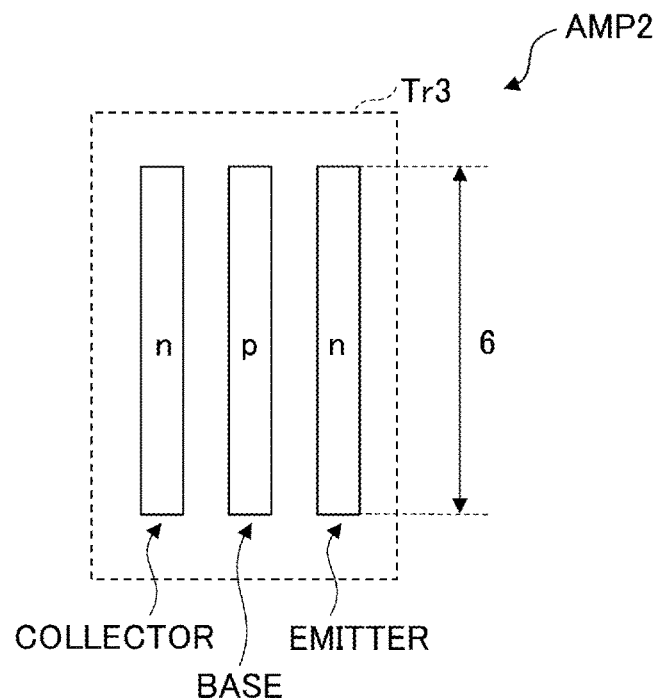
FIG. 6A is a plan view illustrating an example of a structure of a transistor Tr3 of the differential amplifier circuit of FIG. 4.
Figure 6B:
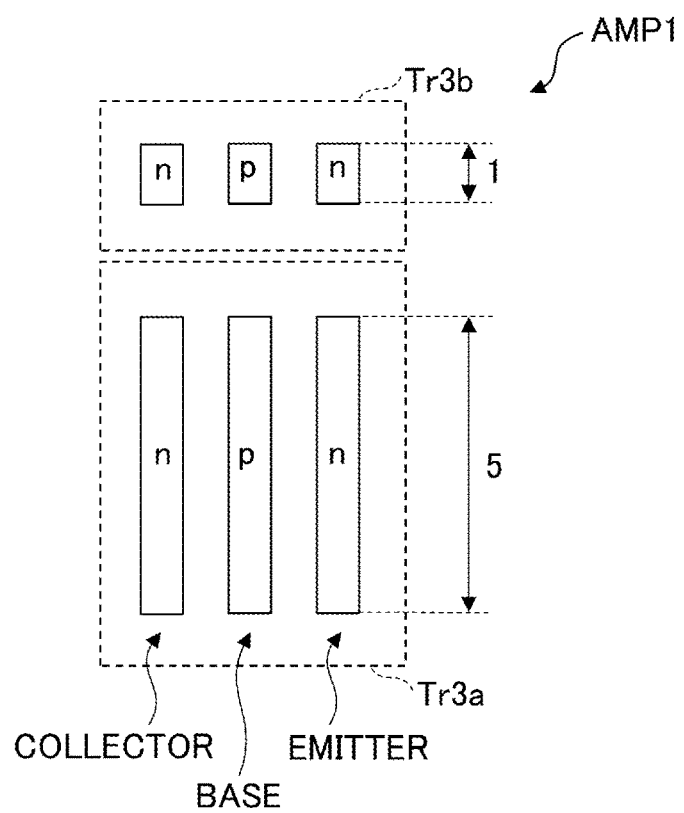
FIG. 6B is a plan view illustrating an example of a structure of transistors Tr3$a$ and Tr3$b$ of the differential amplifier circuit of FIG. 1.

FIG. 6A is a plan view showing an example of the structure of the transistor Tr3 of the differential amplifier circuit AMP2 of FIG. 4. FIG. 6B is a plan view showing an example of the structure of the transistors Tr3$a$ and Tr3$b$ of the differential amplifier circuit AMP1 of FIG. 1. FIGS. 6A and 6B show a layout of the structure when a semiconductor substrate is viewed from above. The structure of the transistor Tr4 of the differential amplifier circuit AMP2 shown in FIG. 4 is the same as that shown in FIG. 6A. The structure of the transistors Tr4$a$ and Tr4$b$ of the differential amplifier circuit AMP1 of FIG. 1 is the same as that of FIG. 6B.

Each of the transistors Tr3, Tr3a, and Tr3b has a collector and an emitter each formed as an n-type diffusion layer, and a base formed as a p-type diffusion layers layer between the collector and the emitter. The current amounts of the transistors Tr3, Tr3a, and Tr3b when a high level is applied to the respective bases are determined by the ratio of the lengths of the transistors Tr3, Tr3a, and Tr3b in the longitudinal direction. The longitudinal direction is a direction intersecting a direction in which the collector, the base, and the emitter are arranged. The longitudinal direction is a direction intersecting a direction in which the current flows from the collector to the emitter. Hereinafter, each length of the transistors Tr3, Tr3a, and Tr3b in the longitudinal direction is also referred to as a size. In the transistors Tr3, Tr3a, and Tr3b, the relative magnitude of the current flowing between the respective collectors and the respective emitters is proportional to the length in the longitudinal direction. For example, in the differential amplifier circuit AMP2, a current (collector current) I1 flows from the collector to the emitter in the transistor Tr3. In the differential amplifier circuit AMP1, a current (collector current) I1a flows from the collector to the emitter in the transistor Tr3a and a current (collector current) I1b flows from the collector to the emitter in the transistor Tr3b.

For example, in the differential amplifier circuit AMP2 shown in FIG. 6A, the size (length) of the transistor Tr3 is set to "6" in an arbitrary unit. For example, in the differential amplifier circuit AMP1 shown in FIG. 6B, the size (length) of the transistor Tr3a is set to "5" in the arbitrary unit, and the size (length) of the transistor Tr3b is set to "1" in the arbitrary unit. Thus, the current ratio I1a:I1b of the transistors Tr3a and Tr3b can be set to 5:1. In order to determine the current ratio depending on the sizes of the two transistors, the transistor Tr3b preferably has the same electrical characteristics as the transistor Tr3a when the two transistors have the same transistor size. For example, the transistor Tr3b may have the same transistor structure as the transistor structure of the transistor Tr3a except for the difference in size. "Having the same electrical characteristics" means that the values of the parameters indicating the electrical characteristics may be different from each other within a practically allowable range of manufacturing variation. Similarly, when the transistors have the same transistor size, the transistor Tr4b preferably has the same electrical characteristics as the electrical characteristics of the transistor Tr4a.

As shown in FIG. 6B, for example, when the transistor Tr3 is divided into transistors Tr3a and Tr3b, the relative positional relationship among the collector, the base, and the emitter of each transistor does not change. For this reason, the layout size (occupied area) including the transistors Tr3a and Tr3b becomes larger than the layout size (occupied area) of the transistor Tr3 as it becomes longer in the longitudinal direction for separation between the transistors Tr3a and Tr3b. However, if the increment is, for example, 50% or less, the differential amplifier circuit AMP1 shown in FIG. 1 can be configured without extensively modifying the layout of the differential amplifier circuit AMP2 shown in FIG. 4.

The size ratio (i.e., division ratio) between the layout size of the transistor Tr3a and the layout size of the transistor Tr3b is set so that the output currents Ioutup1 and Ioutdn1 shown in FIG. 5B are balanced with each other. Further, the sizes of the transistors Tr3a and Tr3b may be determined in consideration of the influence on the gain and linearity of the differential amplifier DAMP.

As described above, in this embodiment, when the voltage of the output terminal Voutn rises or falls, a diverted current flows from the emitter of the transistor Try to the collector of the transistor Tr3b. Further, when the voltage of the output terminal Voutp rises or falls, a diverted current flows from the emitter of the transistor Tr6 to the collector of the transistor Tr4b. Therefore, the diverted current allows the overshoot to be reduced when the voltage of the output terminal Voutn or the output terminal Voutp rises. In addition, the diverted current allows a falling delay to be improved when the voltage of the output terminal Voutn or the output terminal Voutp falls.

By reducing the overshoot at the rising edge and improving the delay at the falling edge, the waveforms of the output signals Voutn and Voutp can be adjusted in a well-balanced manner, and for example, an opening of the eye pattern in the waveforms can be increased. As a result, the driving performance of the differential amplifier circuit AMP1 can be improved.

By making the sizes of the transistors Tr3b and Tr4b smaller than the sizes of the transistors Tr3a and Tr4a, it is possible to reduce an increase in the layout size of the differential amplifier circuit AMP1 while reducing a decrease in the gain of the differential amplifier circuit AMP1. For example, by making the size of the transistor Tr3b smaller than a half of the size of the transistor Tr3a and making the size of the transistor Tr4b smaller than a half of the size of the transistor Tr4a, the increase in the circuit size of the differential amplifier circuit AMP1 can be further reduced.

By relatively adjusting the sizes of the transistors Tr3a and Tr4a and the sizes of the transistors Tr3b and Tr4b, the overshoot and the fall delay of the output signal output from the emitter follower circuit EF1 can be improved more than the differential amplifier circuit AMP2 of FIG. 4, so that when the differential amplifier circuit AMP1 of FIG. 1 is configured, it is not necessary to extensively modify the circuit layout. Therefore, for example, the differential amplifier circuit AMP1 shown in FIG. 1 can be easily configured based on the layout of the differential amplifier circuit AMP2 shown in FIG. 4.

Second Embodiment

[Circuit Configuration of Amplifier Circuit]

Figure 7:
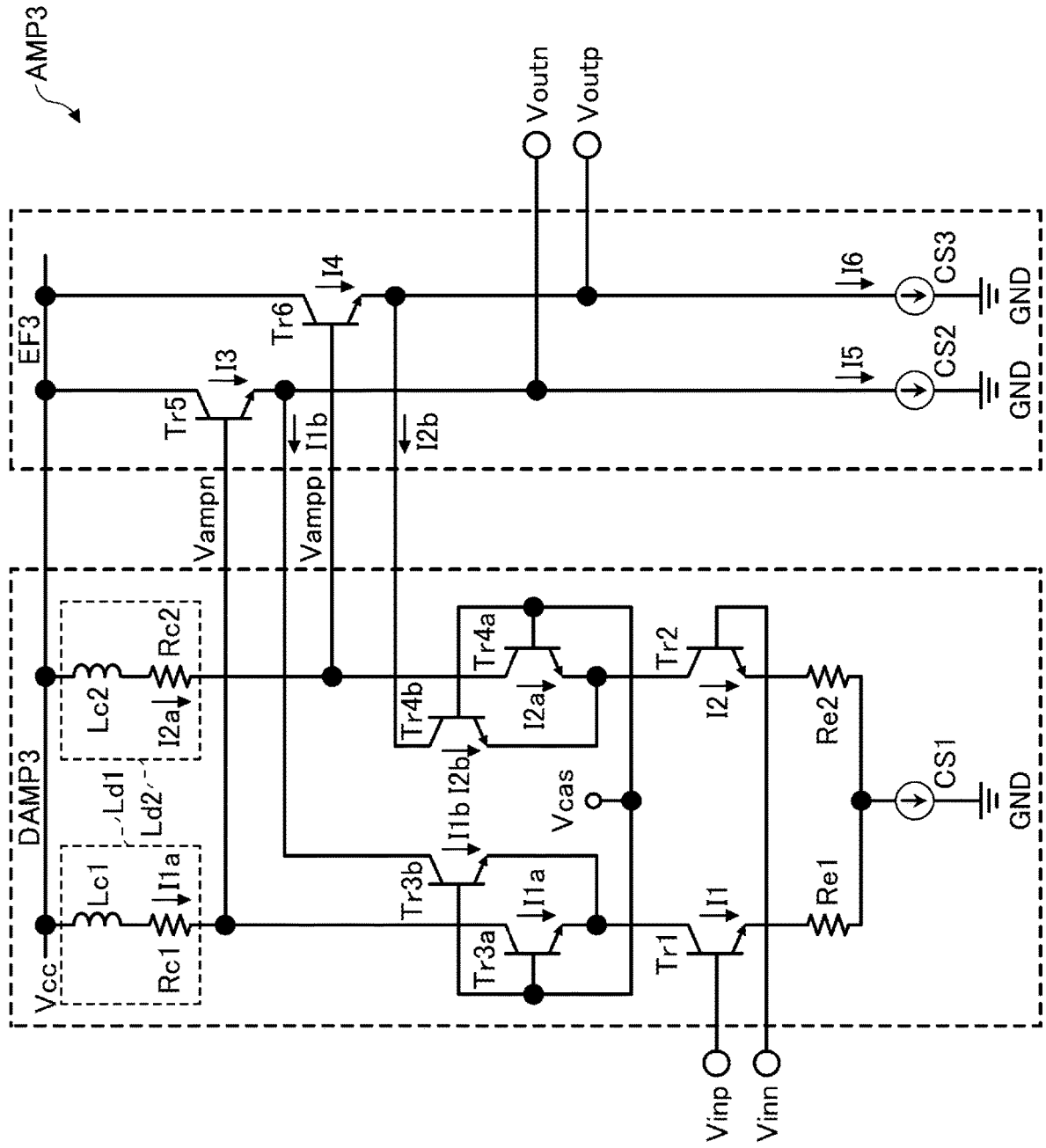
FIG. 7 is a circuit diagram illustrating an example of a configuration of an amplifier circuit according to a second embodiment.

FIG. 7 is a circuit diagram illustrating an example of a configuration of the amplifier circuit according to the second embodiment. Elements corresponding to those of FIG. 1 are given the same reference numerals and will not be described in further detail. The amplifier circuit AMP3 shown in FIG. 7 is a differential amplifier circuit which receives a differential signal and outputs a differential signal. The differential amplifier circuit AMP3 has the same circuit configuration as that of the differential amplifier circuit AMP1 of FIG. 1 except that inductors Lc1 and Lc2 and emitter resistors Re1 and Re2 for peaking are added to the differential amplifier circuit AMP1. The differential amplifier circuit AMP3 includes a differential amplifier DAMP3 and an emitter follower circuit EF3. The arrows shown in FIG. 7 indicate the direction of current flow. The length of the arrows is intended to indicate a relative magnitude relation in comparison with the other figures.

In the differential amplifier DAMP3, the load circuit Ld1 is constituted by a series circuit of a resistance element Rc1 and an inductor Lc1. For example, the inductor Lc1 is connected between the power supply wiring Vcc and the load circuit Rc1. The load circuit Ld2 is constituted by a series circuit of a resistance element Rc2 and an inductor Lc2. For example, the inductor Lc2 is connected between the power supply wiring Vcc and the load circuit Rc2. By adding the inductors Lc1 and Lc2, the gain can be boosted (peaking) in a frequency range around a frequency starting a roll off of the gain, and the bandwidth can be improved. Therefore, for example, by shortening the fall delay of the output signals Voutn and Voutp, it is possible to increase an opening of the eye pattern of the output signal with respect to the higher-speed input signal.

The emitter resistor Re1 is connected between the emitter of the transistor Tr1 and the current source CS1. The emitter resistor Re2 is connected between the emitter of the transistor Tr2 and the current source CS1. By adding the emitter resistors Re1 and Re2, the linearity of the voltage gain can be improved. For example, the range of the input signal in which the voltage of the output signal changes linearly with respect to the voltage of the input signal can be widened.

Figure 8:
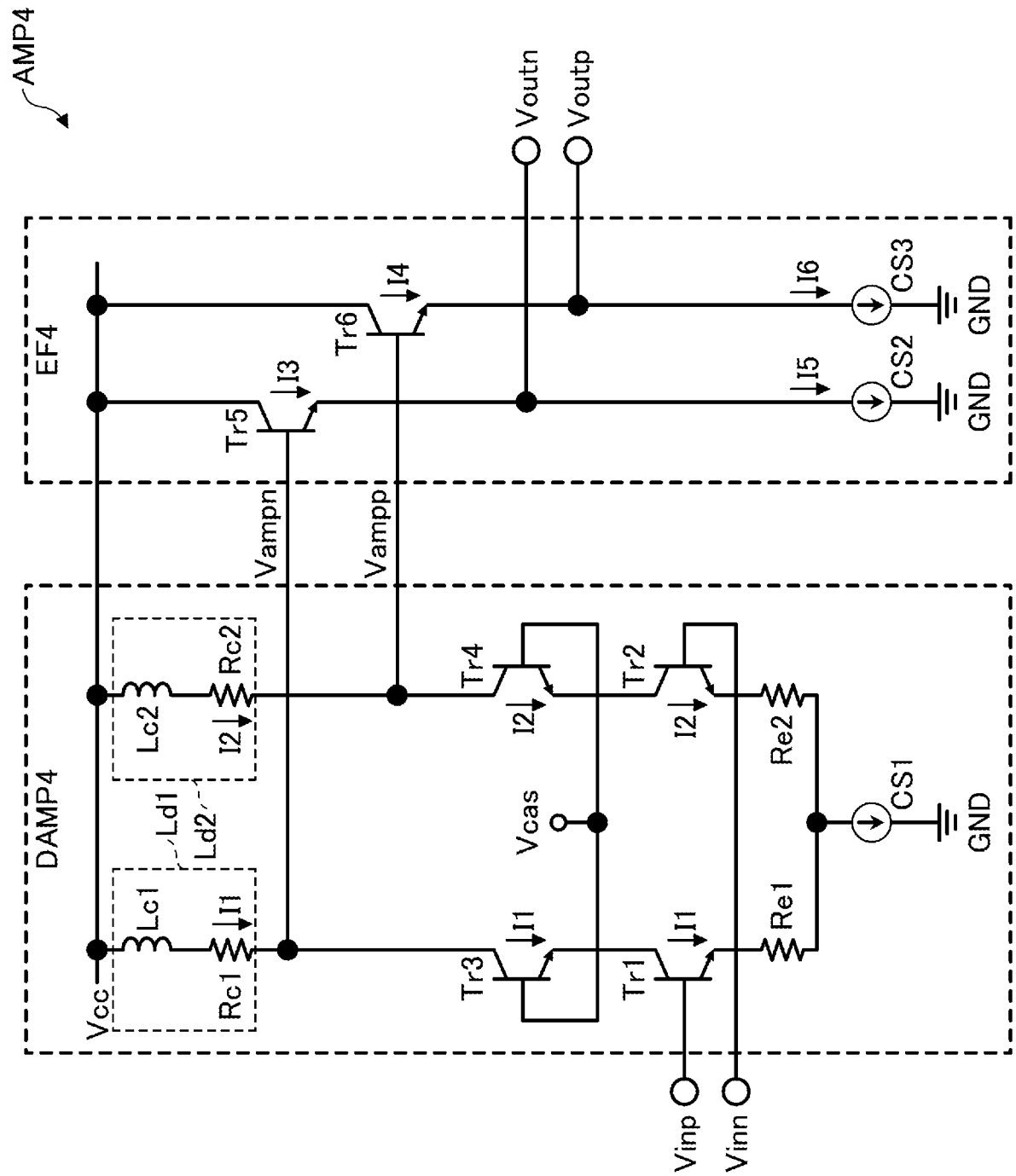
FIG. 8 is a circuit diagram illustrating an example of a configuration of another amplifier circuit.

FIG. 8 is a circuit diagram showing an example of a configuration of another amplifier circuit. Elements corresponding to those of FIG. 4 are given the same reference numerals and will not be described in further detail. The amplifier circuit AMP4 shown in FIG. 8 is a differential amplifier circuit which receives a differential signal and outputs a differential signal. The differential amplifier circuit AMP4 has the same circuit configuration as that of the differential amplifier circuit AMP2 of FIG. 4 except that inductors Lc1 and Lc2 and emitter resistors Re1 and Re2 are added to the differential amplifier circuit AMP2. The positions where the inductors Lc1 and Lc2 and the emitter resistors Re1 and Re2 are added are the same as in FIG. 7. The differential amplifier circuit AMP4 includes a differential amplifier DAMP4 and an emitter follower circuit EF4. The arrows shown in FIG. 8 indicate the direction of current flow. The length of the arrows is intended to indicate a relative magnitude relation in comparison with the other figures.

FIG. 9 is a waveform chart showing an example of the operations of the differential amplifier circuit AMP3 of FIG. 7 and the differential amplifier circuit AMP4 of FIG. 8. FIG. 9 shows voltage waveforms at the differential output terminal Voutn obtained by circuit simulation. In the circuit simulation, a capacitive element is connected as an external load to each differential output terminal Voutn of the differential amplifier circuits AMP3 and AMP4. In the circuit simulation, the circuit element of the differential amplifier circuit AMP4 has the same circuit constant (or electrical characteristic) as the circuit constant (or electrical characteristic) of the corresponding circuit element of the differential amplifier circuit AMP3. For example, the transistor Tr1 of the differential amplifier circuit AMP4 has the same electrical characteristics as the electrical characteristics of the transistor Tr1 of the differential amplifier circuit AMP3.

In the circuit simulation, in each of the differential amplifier circuits AMP3 and AMP4, a waveform of the output terminal Voutn when a pulse amplitude modulation with 4 levels (PAM4) signal is input to the input terminals Vinp and Vinn as a differential input signal is observed simulated. The PAM4 signal is, for example, a signal that transitions between two of four levels L0, L1, L2, L3 in voltage over time. The voltage of each level increases in the order of level L0<level L1<level L2<level L3. The positive phase output signal Voutp is not shown in the figure. The relationship with the negative phase output signal Voutn is as follows: That is, in the differential output signal Voutp, Voutn, for example, when the negative phase output signal Voutn is at the level L0, the positive phase output signal Voutp is at the level L3; when the negative phase output signal Voutn is at the level L1, the positive phase output signal Voutp is at the level L2; when the negative phase output signal Voutn is at the level L2, the positive phase output signal Voutp is at the level L1; and when the negative phase output signal Voutn is at the level L3, the positive phase output signal Voutp is at the level L0. As described above, the positive phase output signal Voutp and the negative phase output signal Voutn are complementary signals to each other, and the voltage waveform of the positive phase output signal Voutp is substantially the same as the voltage waveform of the negative phase output signal Voutn, and thus is not illustrated.

In the differential amplifier circuit AMP3, an overshoot at the rising edge is reduced and delay at the falling edge is improved as compared with the differential amplifier circuit AMP4. As a result, the SNR (Signal Noise Ratio) of the differential amplifier circuit AMP3 is improved to 25.0 dB with respect to 21.8 dB of the differential amplifier circuit AMP4. The SNR is an index indicating the degree of opening in the vertical axis direction of the eye pattern of the voltage waveform, and the SNR increases as the opening of the eye pattern improves. The SNR will be described later.

By improving the delay at the falling edge, the Eye Width, which is an index of the size of the opening, is increased. In the example of FIG. 9, the Eye Width of an eye pattern between level L0 and level L1 is 9.25 ps in the differential amplifier circuit AMP3 as opposed to 9.95 ps in the differential amplifier circuit AMP4. The Eye width is an index indicating the opening of the eye pattern of the voltage waveform in the horizontal axis direction, and the Eye width increases as the opening of the eye pattern increases.

Further, the fall time is improved to 6.6 ps in the differential amplifier circuit AMP3 as compared with 7.9 ps in the differential amplifier circuit AMP4. For example, when the voltage amplitude between the level L3 and the level L0 is set to 100%, the fall time indicates a time from 80% of the voltage amplitude to 20% of the voltage amplitude. In the differential amplifier circuit AMP3, since the discharge current of the load capacitance increases more than the discharge current of the differential amplifier circuit AMP4, the fall edge of the voltage waveform becomes faster.

FIG. 10 is an explanatory diagram showing a calculation example of the SNR shown in FIG. 9. The SNR is calculated by equation (1). A bit error rate (BER) in Equation (1) is calculated by Equation (2). The function P(n to m) represents an error rate when the PAM4 signal transits from the level Ln to the level Lm, where the symbols n and m indicate one of values 0, 1, 2, and 3 of the level L of the PAM4 signal, and are different from one another. The combination of the symbols n and m are expressed by Equations (3) to (8). Each of the symbols n and m is an integer of 0, 1, 2, or 3, and the difference between the integers n and m is 1. That is, the error rate P (n to m) is calculated for levels L adjacent to each other.

The symbol SER indicates a symbol error rate. A symbol μn in Equations (3) to (8) indicates the center value of the level n of the Eye waveform. A symbol σn indicates an effective value RMS (Root Mean Square) of the level n of the Eye waveform. A symbol tnm indicates a time required to acquire and calculate a value between the levels n and m, from the Eye waveform. The SNR increases when the rising edge and the falling edge are improved and the distribution (the effective value σ) of each level L decreases. For example, at a certain level L, when the line width of the level L in the vertical axis direction is thick due to noise or overshoot or undershoot of the voltage waveform, the SNR is small. Therefore, the value of the SNR should be preferably large.

As described above, also in this embodiment, it is possible to obtain the same effect as that of the first embodiment. For example, it is possible to reduce overshoot when the voltage of the output terminal Voutn or the output terminal Voutp rises. In addition, it is possible to improve a falling delay when the voltage of the output terminal Voutn or the output terminal Voutp falls.

Third Embodiment

[Circuit Configuration of Amplifier Circuit]

Figure 11:
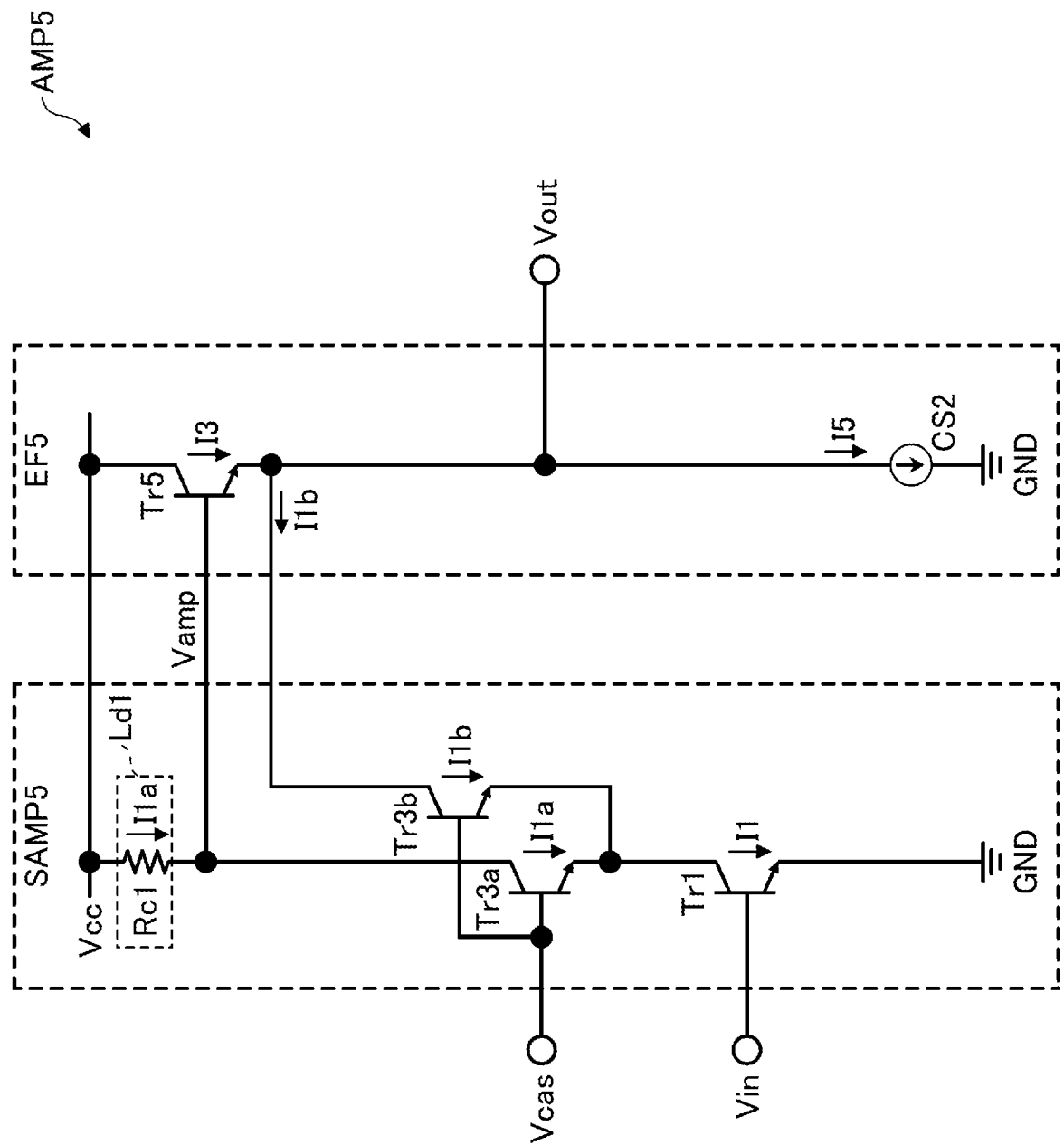
FIG. 11 is a circuit diagram illustrating an example of a configuration of an amplifier circuit according to a third embodiment.

FIG. 11 is a circuit diagram illustrating an example of a configuration of the amplifier circuit according to the third embodiment. Elements corresponding to those of FIG. 1 are given the same reference numerals and will not be described in further detail. The amplifier circuit AMP5 shown in FIG. 11 has an amplifier SAMP5 and an emitter follower circuit EF5. The amplifier circuit AMP5 receives a single ended input signal at an input terminal Vin and outputs a single ended output signal from an output terminal Vout. For example, the amplifier SAMP is a single-ended amplifier. For example, the input terminal Vin corresponds to the input terminal Vinp of FIG. 1, and the output terminal Vout corresponds to the output terminal Voutn of FIG. 1. The arrows shown in FIG. 11 indicate the direction of current flow. The length of the arrows is intended to indicate a relative magnitude relation in comparison with the other figures.

The amplifier SAMP5 is configured by removing the load circuit Ld2, transistor tr4a, Tr4b, Tr2, and current source CS1 from the amplifier DAMP1 of FIG. 1. The emitter of the transistor Tr1 is connected to the grounding wire GND. The emitter follower circuit EF5 is configured by removing the transistor Tr6 and the current source CS3 from the emitter follower circuit EF1 of FIG. 1.

The interconnection among the load circuit Ld1, the transistors Tr3a, Tr3b, Tr1, and Tr5, the current source CS2, the input terminal Vin, the bias terminal Vcas, and the output terminal Vout is the same as that in FIG. 1 except that the names of the input terminal Vin and the output terminal Vout are different.

Although not particularly limited, for example, the transistor Tr3a and the transistor Tr3b are designed such that a ratio I1a:I1b of a current (collector current) I1a flowing between the collector and the emitter of the transistor Tr3a and a current (collector current) I1b flowing between the collector and the emitter of the transistor Tr3b is 5:1. For this reason, the sizes of the transistors Tr3a and Tr3b are set such that the ratio of the longitudinal length of the transistor Tr3a to the longitudinal length of the transistor Tr3b is 5:1 as shown in FIG. 6. The longitudinal length of the transistor Tr3b should be smaller than that of transistor Tr3a.

The waveform of the output signal Vout during the operation of the amplifier circuit AMP5 is similar to the waveform of the differential amplifier circuit AMP3 shown in FIG. 9. Like the differential amplifier circuit AMP3 shown in FIG. 7, the amplifier circuit AMP5 may be provided with an inductor Lc1 for peaking and an emitter resistor Re1.

As described above, also in this embodiment, it is possible to obtain the same effect as that of the above-described embodiment. That is, also in the amplifier circuit AMP5 that amplifies a single-ended signal, the overshoot when the voltage of the output terminal Vout rises can be reduced, and the fall delay when the voltage of the output terminal Vout falls can be improved.

Fourth Embodiment

[Circuit Configuration of Amplifier Circuit]

Figure 12:
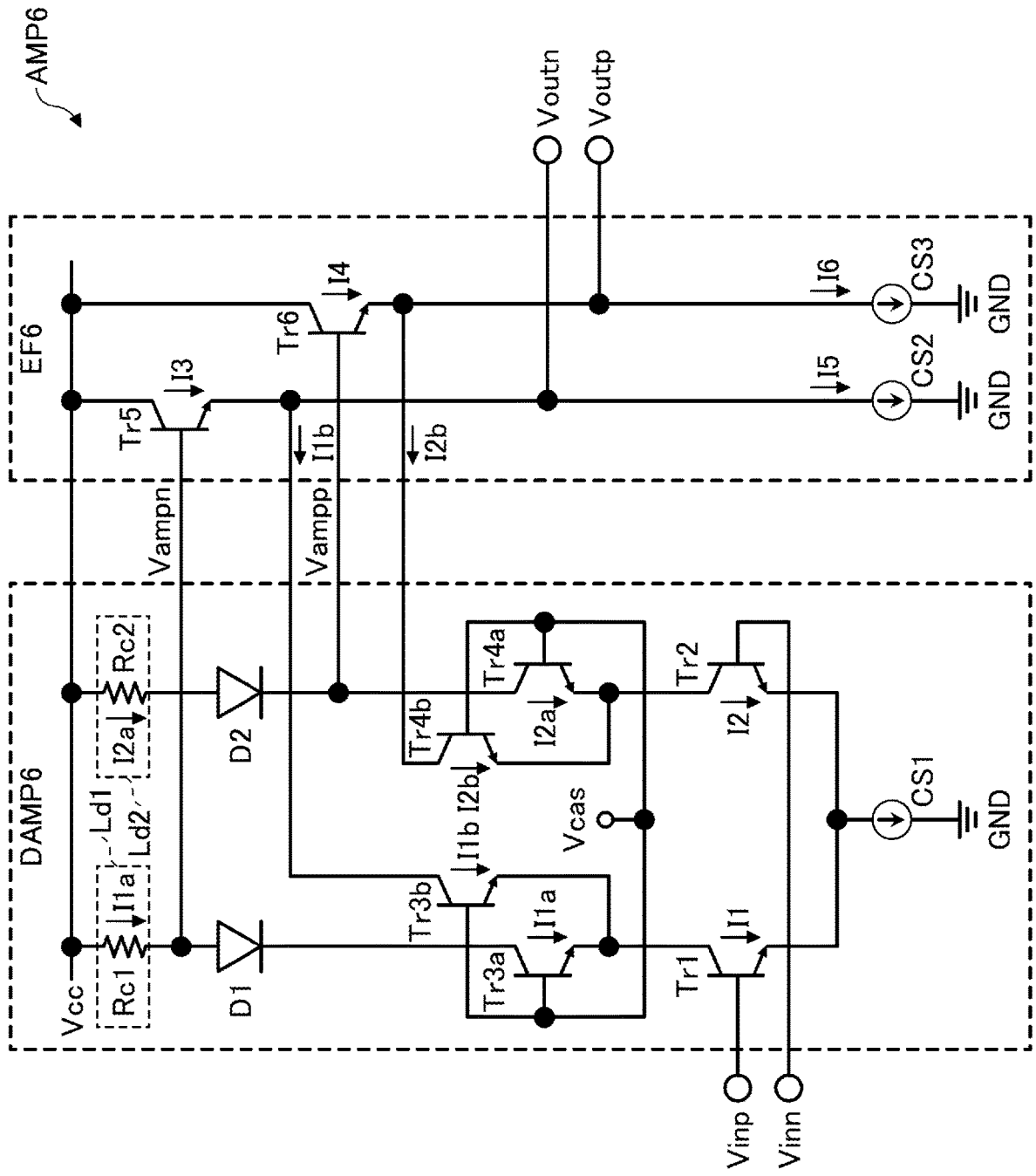
FIG. 12 is a circuit diagram illustrating an example of a configuration of an amplifier circuit according to a fourth embodiment.

FIG. 12 is a circuit diagram illustrating an example of a configuration of the amplifier circuit according to the fourth embodiment. Elements corresponding to those of FIG. 1 are given the same reference numerals and will not be described in further detail. The amplifier circuit AMP6 shown in FIG. 12 is a differential amplifier circuit which receives a differential signal and outputs a differential signal. The differential amplifier circuit AMP6 has the same circuit configuration as that of the differential amplifier circuit AMP1 of FIG. 1 except that diodes D1 and D2 are added to the differential amplifier circuit AMP1. The differential amplifier circuit AMP6 includes a differential amplifier DAMP6 and an emitter-follower circuit EF6. The arrows shown in FIG. 12 indicate the direction of current flow. The length of the arrows is intended to indicate a relative magnitude relation in comparison with the other figures.

An anode of the diode D1 is electrically connected to the other end of the load circuit Ld1 and the base of the transistor Tr5. The cathode of the diode D1 is electrically connected to the collector of the transistor Tr3a. An anode of the diode D2 is electrically connected to the other end of the load circuit Ld2 and the base of the transistor Tr6. The cathode of the diode D2 is electrically connected to the collector of the transistor Tr4a. The diodes D1 and D2 are examples of voltage-drop elements.

For example, the diode D1 is set such that the amount of voltage drop between the cathode and the anode becomes equal to the base-emitter voltage Vbe of the transistor Tr5. For example, the characteristic (voltage-current characteristic) indicating the relationship between the forward voltage Vd1 and the forward current Id1 of the diode D1 may be set to be the same as the characteristic (input characteristic) indicating the relationship between the base-emitter voltage Vbe and the base current Ib of the transistor Tr5. For example, as the diode D1, the base of a bipolar transistor Tr5a having the same electrical characteristics as the transistor Tr5 may be used as the cathode, and the emitter of the bipolar transistor Tr5a may be used as the cathode. At this time, the collector of the bipolar transistor Tr5a may be connected to the emitter of the bipolar transistor Tr5a. The size of the diode D1 (transistor Tr5a) and the size of the bipolar transistor Tr5 may be set according to the current I1a and the emitter-follower current I3, respectively. The diode D2 is set so that the amount of its voltage drop becomes equal to the base-emitter voltage Vbe of the transistor Tr6. For example, the voltage-current characteristic of the diode D2 may be set to be the same as the input characteristic of the transistor Tr5. For example, as the diode D2, the base of a bipolar transistor Tr6a having the same electrical characteristics as the transistor Tr6 may be used as the cathode, and the emitter of the bipolar transistor Tr6a may be used as the cathode. At this time, the collector of the bipolar transistor Tr6a may be connected to the emitter of the bipolar transistor Tr6a. The size of the diode D2 (transistor Tr6a) and the size of the bipolar transistor Tr6 may be set according to the current I2b and the emitter-follower current I4, respectively. Thus, the collector-emitter voltage of the transistor Tr3a can be made equal to the collector-emitter voltage of the transistor Tr3b. Similarly, the collector-emitter voltage of the transistor Tr4a can be made equal to the collector-emitter voltage of the transistor Tr4b.

Since the collector-emitter voltage of the transistor Tr3a becomes substantially the same as the collector-emitter voltage of the transistor Tr3b due to the addition of the diode D1, for example, the influence of the Early effect in the saturation region of the collector current can be reduced. By adding the diode D2, the collector-emitter voltage of the transistor Tr4a becomes substantially the same as the collector-emitter voltage of the transistor Tr4b, so that the influence of the Early effect can be reduced. Thus, regardless of the voltage Vampn input to the base of the bipolar transistor Tr5, the current ratio of the respective currents flowing through the transistors Tr3a and Tr3b can be determined more accurately by the size ratio of the respective sizes of the transistors Tr3a and Tr3b. Similarly, regardless of the voltage Vampp input to the base of the bipolar transistor Tr6, the current ratio of the respective currents flowing through the transistors Tr4a and Tr4b can be determined more accurately by the size ratio of the respective sizes of the transistors Tr4a and Tr4b. Therefore, regardless of the voltage of the differential voltage signal Vampp, Vampn output from the differential amplifier DAMP6, the ratio of the differential current signal I1a, I2a to the differential current signal I1b, I2b can be more accurately equal to the ratio of the size of the transistors Tr3a and Tr4a to the size of the transistors Tr3b and Tr4b, where the transistor Tr4a has a size equal to a size of the transistor Tr3a and the transistor Tr4b has a size equal to a size of the transistor Tr3b. As a result, the circuit design of the differential amplifier circuit AMP6 can be made more accurately than in the case where the diodes D1 and D2 are not added.

As described above, also in this embodiment, the overshoot and the fall delay of the output signals Voutn and Voutp can be reduced as in the above-described embodiment. Further, in this embodiment, by adding the diode D1, the collector-emitter voltage of the transistor Tr3a can be made equal to the collector-emitter voltage of the transistor Tr3b, and the current ratio of the respective currents flowing through the transistors Tr3a and Tr3b can be more accurately determined by the size ratio of the respective sizes of the transistors Tr3a and Tr3b mutually having the same electrical characteristics. Further, by adding the diode D2, the collector-emitter voltage of the transistor Tr4a can be made equal to the collector-emitter voltage of the transistor Tr4b, and the current ratio of the respective currents flowing through the transistors Tr4a and Tr4b can be more accurately determined by the size ratio of the respective sizes of the transistors Tr4a and Tr4b mutually having the same electrical characteristics. As a result, the circuit design of the differential amplifier circuit AMP6 can be made more accurately than in the case where the diodes D1 and D2 are not added. The current ratio can be determined regardless of the influence of the Early effect with respect to the cascode transistors Tr3a, Tr4a and the diverting transistors Tr3b, Tr4b.

In the amplifier circuit AMP5 of FIG. 11, the diode D1 may be inserted between the load circuit Ld1 and the collector of the transistor Tr3a. Also, in this case, the collector-emitter voltage of the transistor Tr3a can be made equal to the collector-emitter voltage of the transistor Tr3b. Accordingly, regardless of the voltage of the voltage signal Vamp output from the amplifier SAMP5, the current ratio of the respective currents flowing through the transistors Tr3a and Tr3b can be more accurately determined by the size ratio of the respective sizes of the transistors Tr3a and Tr3b mutually having the same electrical characteristics. As a result, the circuit design of the amplifier circuit AMP5 can be made more accurately than in the case where the diode D1 is not added. The current ratio can be determined regardless of the influence of the Early effect with respect to the cascode transistor Tr3a and the diverting transistor Tr3b.

Although embodiments and the like of the present disclosure have been described above, the present disclosure is not limited to the embodiments and the like. Various changes, modifications, substitutions, additions, deletions, and combinations are possible within the scope described in the claims. They also naturally belong to the technical scope of the present disclosure.

What is claimed is:

1. An amplifier circuit comprising:
 a first input terminal and a second input terminal configured to receive a differential input signal;
 a first output terminal and a second output terminal configured to output a differential output signal;
 a first transistor and a second transistor electrically connected respectively to the first input terminal and the second input terminal, the first transistor and the second transistor being configured to generate a differential current signal in accordance with the differential input signal;
 a current source electrically connected between a grounding wire and a pair of the first transistor and the second transistor, the current source being configured to supply a static current to the first transistor and the second transistor;
 a first load circuit and a second load circuit configured to generate a differential voltage signal as an amplified signal from the differential input signal;
 a first emitter-follower circuit and a second emitter-follower circuit, the first emitter-follower circuit being electrically connected between the first load circuit and the first output terminal, the second emitter-follower circuit being electrically connected between the second load circuit and the second output terminal, and the first emitter-follower circuit and the second emitter-follower circuit being configured to generate the differential output signal in accordance with the differential voltage signal;
 a first cascode transistor and a second cascode transistor, the first cascode transistor being electrically connected between the first transistor and the first load circuit, the second cascode transistor being electrically connected between the second transistor and the second load circuit; and
 a first shunt transistor and a second shunt transistor, the first shunt transistor being electrically connected between the first transistor and the first emitter-follower circuit, the second shunt transistor being electrically connected between the second transistor and the second emitter-follower circuit;
 wherein the differential current signal includes a first differential current and a second differential current, the first differential current flowing through the first cascode transistor and the second cascode transistor, and the second differential current flowing through the first shunt transistor and the second shunt transistor;
 wherein the first load circuit and the second load circuit are configured to convert the first differential current into the differential voltage signal, and
 wherein the first emitter-follower circuit and the second emitter-follower circuit are configured to
  generate a first emitter-follower current and a second emitter-follower current, and
  generate the differential output signal by diverting the second differential current from the first emitter-follower current and the second emitter-follower current.

2. The amplifier circuit according to claim 1, wherein the first shunt transistor and the second shunt transistor respectively have sizes that are smaller than sizes of the first cascode transistor and the second cascode transistor.

3. The amplifier circuit according to claim 2, wherein each of the first shunt transistor and the second shunt transistor has a size that is smaller than half a size of a corresponding cascode transistor among the first cascode transistor and the second cascode transistor.

4. The amplifier circuit according to claim 1, further comprising a first voltage-drop element and a second voltage-drop element, the first voltage-drop element being electrically connected between the first load circuit and the first cascode transistor, and the second voltage-drop element being electrically connected between the second load circuit and the second cascode transistor.

5. An amplifier circuit comprising:
- an input terminal to which an input signal is configured to be applied;
- an output terminal via which an output signal is configured to be output;
- a switching transistor electrically connected to the input terminal, the switching transistor being configured to generate a current signal in accordance with the input signal;
- a load circuit configured to generate a voltage signal as an amplified signal from the input signal;
- an emitter-follower circuit electrically connected between the load circuit and the output terminal, the emitter-follower circuit configured to generate the output signal in accordance with the voltage signal;
- a cascode transistor electrically connected between the switching transistor and the load circuit; and
- a shunt transistor electrically connected between the switching transistor and the emitter-follower circuit,
- wherein the current signal includes a first current and a second current, the first current flowing through the cascode transistor, and the second current flowing through the shunt transistor,
- wherein the load circuit is configured to convert the first current into the voltage signal, and
- wherein the emitter-follower circuit is configured to
  - generate an emitter-follower current, and
  - generate the output signal by drawing the second current from the emitter-follower current.

6. The amplifier circuit according to claim 5, wherein the shunt transistor has a size that is smaller than a size of the cascode transistor.

7. The amplifier circuit according to claim 6, wherein the shunt transistor has a size that is smaller than half the size of the cascode transistor.

8. The amplifier circuit according to claim 5, further comprising a voltage-drop element electrically connected between the load circuit and the cascode transistor.

* * * * *